US010867937B2

(12) United States Patent
Rajendran et al.

(10) Patent No.: US 10,867,937 B2
(45) Date of Patent: Dec. 15, 2020

(54) DEFENSE TECHNIQUES FOR SPLIT MANUFACTURING

(71) Applicants: Board of Regents, The University of Texas System, Austin, TX (US); The Texas A & M University System, College Station, TX (US); Nankai University, Nankai Qu (CN)

(72) Inventors: Jeyavijayan Rajendran, Dallas, TX (US); Jiang Hu, College Station, TX (US); Yujie Wang, Tianjin (CN); Pu Chen, Seattle, WA (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 15/987,309

(22) Filed: May 23, 2018

(65) Prior Publication Data

US 2018/0342468 A1 Nov. 29, 2018

Related U.S. Application Data

(60) Provisional application No. 62/509,984, filed on May 23, 2017.

(51) Int. Cl.
*G06F 17/50* (2006.01)
*H01L 23/00* (2006.01)

(52) U.S. Cl.
CPC .......... *H01L 23/573* (2013.01); *G06F 17/505* (2013.01); *G06F 17/5022* (2013.01); *G06F 17/5068* (2013.01); *G06F 17/5072* (2013.01); *G06F 17/5077* (2013.01); *G06F 17/5081* (2013.01); *H01L 23/576* (2013.01)

(58) Field of Classification Search
USPC ........................................................ 716/136
See application file for complete search history.

(56) References Cited

U.S. PATENT DOCUMENTS

| | | | |
|---|---|---|---|
| 5,536,955 A * | 7/1996 | Ali | H01L 27/0207 257/204 |
| 7,195,931 B2 | 3/2007 | Jarvis et al. | |
| 8,881,089 B1 * | 11/2014 | Alpert | G06F 17/5068 716/132 |

OTHER PUBLICATIONS

Y. Bi; et al (2015) "Beyond the Interconnections: Split Manufacturing in RF Designs" Electronics. 4, p. 541-564 www.mdpi.com/journal/electronics.
S. Bhunia; et al (2014) "Hardware Trojan Attacks: Threat Analysis and Countermeasures" Proceedings of the IEEE. vol. 102, No. 8. p. 1229-1247.
F. Corno (2000) "RT-level ITC'99 Benchmarks and First ATPG Results" IEEE Design & Test of Computers. vol. 17, No. 3, pp. 44-53.

(Continued)

*Primary Examiner* — Bryce M Aisaka
(74) *Attorney, Agent, or Firm* — Thomas|Horstemeyer, LLP

(57) ABSTRACT

Disclosed are various embodiments to enhance the security of a circuit design after a global routing of the circuit design and an assignment of wire layers for the circuit design. A tree can be extracted from the circuit design. The tree can include multiple gates and location information for the gates. The tree can be perturbed by moving one or more locations of one or more gates.

20 Claims, 17 Drawing Sheets

(56) References Cited

OTHER PUBLICATIONS

DARPA. (2005). "Study on High Performance Microchip Supply." Defense Science Board (DSB) http://www.acq.osd.mil/dsb/reports/ADA435563.pdf.
DIGITIMES (2012) "Trends in the Global IC Design Service Market" http://www.digitimes.com/news/a20120313RS400.html?chid=2.
L. H. Goldstein and E. L. Thigpen, "Scoap: Sandia controllability/observability analysis program," in Proceedings of the ACM/IEEE Design Automation Conference, pp. 190-196, 1980.
J. Guin (2014) "Counterfeit Integrated Circuits: A Rising Threat in the Global Semiconductor Supply Chain" Proceedings of the IEEE. vol. 102, No. 8, p. 1207-1228.
M. Hansen (1999) "Unveiling the ISCAS-85 Benchmarks: A Case Study in Reverse Engineering" IEEE Design & Test of Computers. p. 72-80.
B. Hill; et al (2013) "A Split-Foundry Asynchronous FPGA" Proc. IEEE Custom Integr. Circuits Conf. pp. 1-4.
F. Imeson; et al (2013) "Securing Computer Hardware Using 3D Integrated Circuit (IC) Technology and Split Manufacturing for Obfuscation" USENIX Association. p. 495-510.
M. Jagasivamani; et al (2014) "Split-Fabrication Obfuscation: Metrics and Techniques" IEEE International Symposium on Hardware-Oriented Security and Trust, p. 7-12.
J. Rajendran; et al (2013) "Is Split Manufacturing Secure?" IEEE/ACM Design Automation and Test in Europe, pp. 1259-1264.
Y. Liu; et al (2011) "Simultaneous Technology Mapping and Placement for Delay Minimization" IEEE Trans. Comput.-Aided Design Integr. Circuits Syst., vol. 30, No. 3, pp. 416-426.
S. Mitra; et al (2015) "Stopping Hardware Trojans in Their Tracks" Stopping Hardware Trojans in Their Tracks—IEEE Spectrum. p. 1-5.
C. Otero; et al (2015) "Automatic Obfuscated Cell Layout for Trusted Split-Foundry Design" IEEE Int. Symp. Hardw. Oriented Secur. Trust, pp. 56-61.
J. Rajendran; et al (2010) "Towards a comprehensive and systematic classification of hardware Trojans" IEEE Int. Symp. Circuits Syst., pp. 1871-1874.
J. Rajendran; et al (2013) "Security Analysis of Integrated Circuit Camouflaging" Proc. ACM SIGSAC Conf. Comput. Commun. Secur. pp. 709-720. http://doi.acm.org/10.1145/2508859.2516656.
J. Rajendran; et al (2012) "Security analysis of logic obfuscation," in Proc. IEEE/ACM Design Autom. Conf. pp. 83-89.
J. Rajendran; et al (2012) "Logic Encryption: A Fault Analysis Perspective," Proc. Design, Automation Test in Europe, pp. 953-958.
M. Rostami (2014) "A Primer on Hardware Security: Models, Methods, and Metrics" Proceedings of the IEEE, vol. 102, No. 8, p. 1283-1295.
J. Roy; et al (2010) "EPIC: Ending Piracy of Integrated Circuits" Computer, vol. 43, No. 10, pp. 30-38.
SEMI. (2008). "Innovation is at risk as semiconductor equipment and materials industry loses up to $4 billion annually due to IP infringement." http://www.semi.org/en/Press/P043775.
M. Tehranipoor; et al (2010) "A Survey of Hardware Trojan Taxonomy and Detection" IEEE Design & Test of Computers,vol. 27, No. 1, p. 10-25.
R. Torrance; et al (2011) "The State-of-the-Art in Semiconductor Reverse Engineering" IEEE/ACM Design Automation Conference, pp. 333-338.
K. Vaidyanathan; et al (2014) "Building Trusted ICs Using Split Fabrication" IEEE International Symposium on Hardware-Oriented Security and Trust, p. 1-6.
K. Vaidyanathan; et al (2014) "Efficient and Secure Intellectual Property (IP) Design With Split Fabrication," in Proc. IEEE Symp. Hardw. Oriented Secur. Trust, pp. 13-18.
K. Vaidyanathan; et al (2014) "Detecting Reliability Attacks during Split Fabrication using Test-only BEOL Stack" Proc. IEEE/ACM Design Autom. Conf., p. 156:1-156:6.
J. Valamehr; et al (2013) "A 3-D Split Manufacturing Approach to Trustworthy System Development" IEEE Transactions on Computer-Aided Design of Integrated Circuits and Systems, vol. 32, No. 4, p. 611-615.
Y. Wang; et al (2018) "The Cat and Mouse in Split Manufacturing" IEEE Transactions on Very Large Scale Integration (VLSI) Systems, vol. 26, No. 5, p. 805-817.
K. Xiao; et al (2015) "Efficient and Secure Split Manufacturing via Obfuscated Built-In Self-Authentication" IEEE International Symposium on Hardware Oriented Security and Trust, p. 14-19.
Y. Xie; et al (2015) "Security-Aware Design Flow for 2.5D IC Technology" ACM International Workshop on Trustworthy Embedded Devices, pp. 31-38.
Y. Wang; et al (2017) "Routing Perturbation for Enhanced Security in Split Manufacturing" IEEE, p. 1-6.

\* cited by examiner

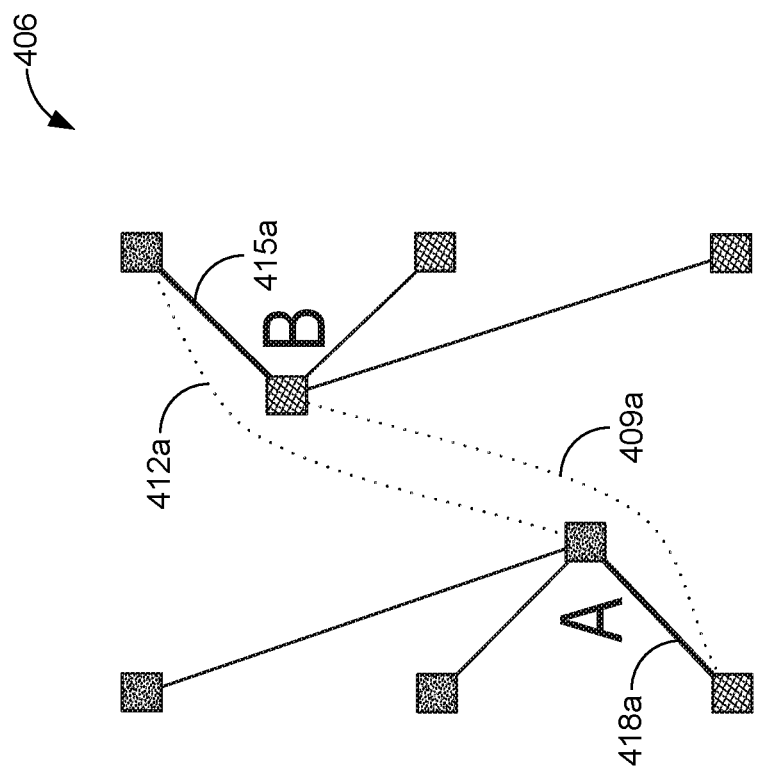

(a)

(b)

DEFENSE TECHNIQUES FOR SPLIT MANUFACTURING

CROSS-REFERENCE TO RELATED APPLICATIONS

This application claims the benefit of U.S. Provisional Application No. 62/509,984, filed May 23, 2017, the entire contents of which is hereby incorporated herein by reference.

GOVERNMENT LICENSE RIGHTS

This invention was made with government support under 1618797 awarded by the National Science Foundation. The government has certain rights in the invention.

BACKGROUND

The cost of owning and maintaining a state-of-the-art semiconductor manufacturing facility has become enormously expensive, even several billion dollars. Consequently, only high-end commercial foundries now manufacture high performance, mixed system integrated circuits (ICs), especially at the advanced technology nodes. Without the economies of scale, many design companies cannot afford owning and acquiring expensive foundries; hence, outsourcing their fabrication process to these "one-stop-shop" foundries becomes a necessity. Globalization of IC production flow has reduced design complexity and fabrication cost, but it has introduced several security vulnerabilities.

An attacker anywhere in the IC supply chain can perform the following attacks: reverse engineering, malicious circuit insertion, counterfeiting, and intellectual property (IP) piracy. Due to these attacks, the semiconductor industry loses billions of dollars annually. This is because designers have no control over their design in this distributed supply chain, and, more importantly, current electronic design automation (EDA) tools do not consider security as a design objective.

BRIEF DESCRIPTION OF THE DRAWINGS

For a more complete understanding of the embodiments and the advantages thereof, reference is now made to the following description, in conjunction with the accompanying figures briefly described as follows:

FIGS. 4A-4C are layouts of example circuits according to various example embodiments.

Figure 1:
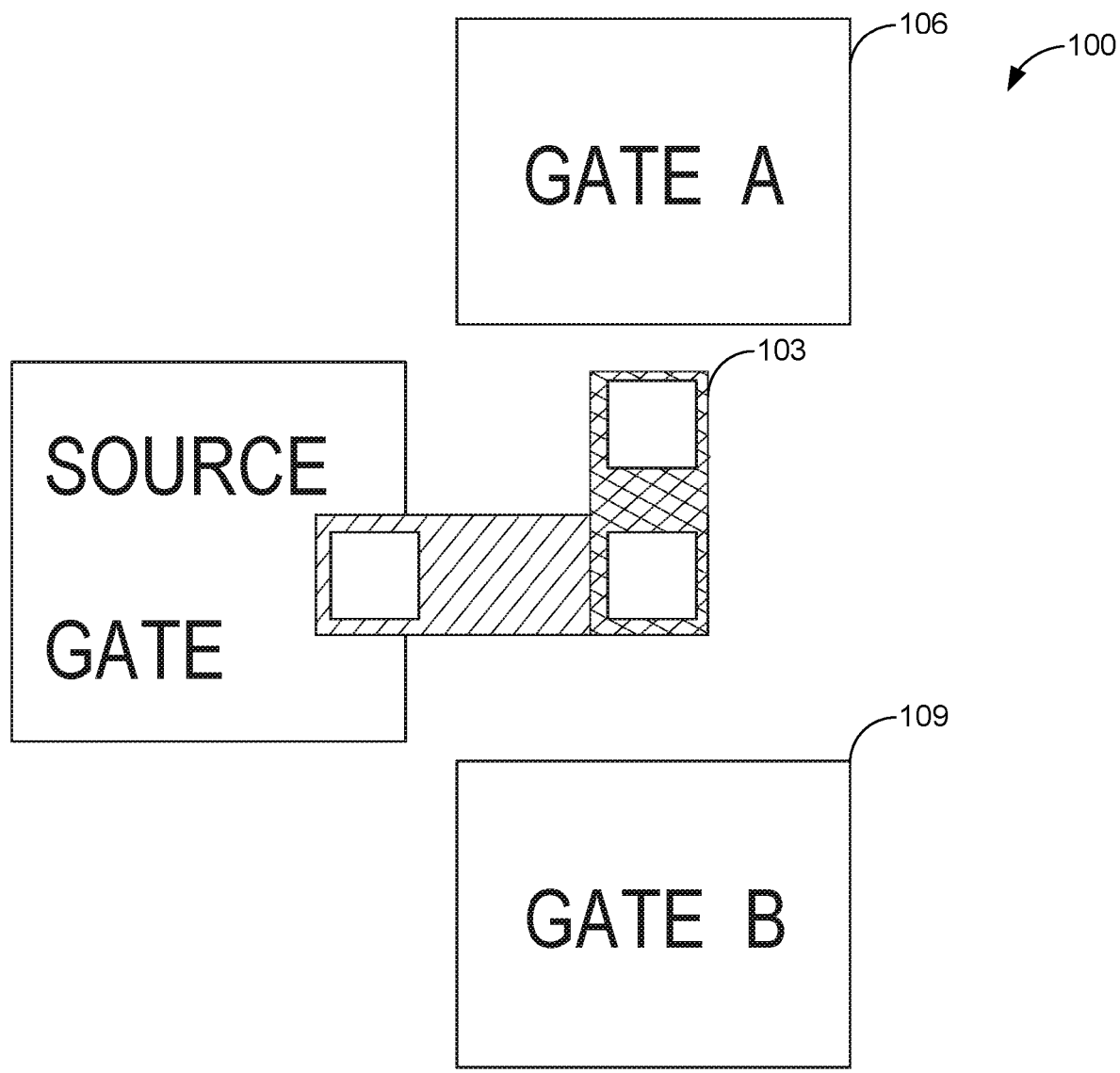
FIG. 1 is a layout of a circuit according to various example embodiments.

The drawings illustrate only example embodiments and are therefore not to be considered limiting of the scope described herein, as other equally effective embodiments are within the scope and spirit of this disclosure. The elements and features shown in the drawings are not necessarily drawn to scale, emphasis instead being placed upon clearly illustrating the principles of the embodiments. Additionally, certain dimensions may be exaggerated to help visually convey certain principles. In the drawings, similar reference numerals between figures designate like or corresponding, but not necessarily the same, elements.

DETAILED DESCRIPTION

In the following paragraphs, the embodiments are described in further detail by way of example with reference to the attached drawings. In the description, well known components, methods, and/or processing techniques are omitted or briefly described so as not to obscure the embodiments. As used herein, the "present invention" refers to any one of the embodiments of the invention described herein and any equivalents. Furthermore, reference to various feature(s) of the "present invention" is not to suggest that all embodiments must include the referenced feature(s).

Among embodiments, some aspects of the present invention are implemented by a computer program executed by one or more processors, as described and illustrated. As would be apparent to one having ordinary skill in the art, the present invention may be implemented, at least in part, by computer-readable instructions in various forms, and the present invention is not intended to be limiting to a particular set or sequence of instructions executed by the processor.

The embodiments described herein are not limited in application to the details set forth in the following description or illustrated in the drawings. The invention is capable of other embodiments and of being practiced or carried out in various ways. Also, the phraseology and terminology used herein is for the purpose of description and should not be regarded as limiting. The use of "including," "comprising," or "having" and variations thereof herein is meant to encompass the items listed thereafter, additional items, and equivalents thereof. The terms "connected" and "coupled" are used broadly and encompass both direct and indirect connections and couplings. In addition, the terms "connected" and "coupled" are not limited to electrical, physical, or mechanical connections or couplings. As used herein the terms "machine," "computer," "server," and "work station" are not limited to a device with a single processor, but may encompass multiple devices (e.g., computers) linked in a system, devices with multiple processors, special purpose devices, devices with various peripherals and input and output devices, software acting as a computer or server, and combinations of the above.

Split manufacturing of integrated circuits eliminates vulnerabilities introduced by an untrusted foundry by manufacturing only a part of design at an untrusted high-end foundry and the remaining part at a trusted low-end foundry. Most researchers have focused on attack and defenses for hierarchical designs and/or use a relatively high-end trusted foundry, leading to high cost. An attack and defense for split manufacturing for industry-standard/relevant flattened designs is proposed. The attack uses network-flow model and outperforms previous attacks. A defense technique using placement perturbation while considering overhead is also disclosed. The effectiveness of the attack and defense techniques is demonstrated on benchmark circuits.

Split manufacturing of integrated circuits reduces vulnerabilities introduced by an untrusted foundry by manufacturing only the front-end-of-line (FEOL) layers at an untrusted high-end foundry and the back-end-of-line (BEOL) layers at a trusted low-end foundry. An attacker in the untrusted foundry has access only to an incomplete design, i.e., the FEOL but not the BEOL. Thus, the attacker can neither pirate nor insert Trojans into it without performing an attack technique with a high success rate. Recently, researchers have successfully fabricated split-manufactured designs with ~0% faults and 5% performance overhead, including a 1.3-million-transistor asynchronous FPGA. Moreover, research from industry has shown that split manufacturing can help improve yield. Although promising and feasible, split manufacturing still faces several challenges including, but not limited to, the following challenges:

Challenge 1: Naive split manufacturing alone does not ensure security. An attacker can use heuristics of physical design tools to undermine the security offered by split manufacturing.

Challenge 2: Defense techniques usually incur overhead, such as, for example, timing, power, or area overhead. Hence, one needs to minimize overhead while satisfying the security objective. However, current physical design tools do not ensure this criterion.

The threat model can be as follows. The objective of the attacker is to retrieve the missing BEOL connections from the FEOL connections. Since the attacker is in the FEOL foundry, the attacker has access to the technology library. Consequently, the attacker can obtain the following information about logic gates: layout structure, delay, capacitance load, and wire capacitance. Based on this information, an attacker can reverse engineer the FEOL components and thereby obtain the incomplete gate-level netlist. The incomplete gate-level network lacks the BEOL information. For this purpose, the attacker can use existing reverse-engineering tools to attempt to recreate at least part of the BEOL information. In some embodiments, it can be assumed that the attacker neither knows the functionality implemented by the design nor has access to an IC that performs that function.

The semiconductor industry proposed split manufacturing in the early 2000s to improve yield by using only defect-free FEOL parts. Recently, the Intelligence Advanced Research Project Agency (IARPA) proposed split manufacturing for security. Split manufacturing is feasible, as several research groups have successfully demonstrated fully functional split-manufactured designs: 32-bit multiplier, DES, and SRAM circuits; asynchronous FPGA; and RRAM-based split manufacturing. Split manufacturing for analog designs has also been proposed.

An attack called proximity attack has been in proposed. This attack aims to recover the missing BEOL connections using the physical proximity of the FEOL components and the heuristics of the physical design tools. To thwart this attack, a pin-swapping technique can be used to swap the block pins in the layout such that the Hamming distance between the original design and the design recovered by proximity attack is close to 50%. The disadvantages of this work are it is applicable only to hierarchical designs, while most designs used by industry are flattened designs; and it incurs a performance overhead of 25%.

M2 can be used as the split layer to increase security, but at the expense of increased cost of the BEOL foundry. To improve the pin-swapping defense, a security-driven circuit partitioning algorithm and simulated annealing based placement algorithm can be used. However, simulated annealing can be very slow for large designs and rarely used in modern cell placers.

TABLE 1

Relevance to related work, "—" indicates that information is unavailable. "H" and "F" indicate applicability to hierarchical and flattened designs, respectively. (Res. means Resiliency to proximity attack)

| Technique | Split layer | H/F | Res. | Security metric | Overhead |
|---|---|---|---|---|---|
| [2] | M4 | F | No | — | — |
| [10] | M4 | H | Yes | Hamming distance | 25% (delay) |
| [13] | M1 | F | Yes | # of known functions | 77% (area) |
| [11, 12, 16] | M1 | F | Yes | # of wrong connections | 5% (delay) |
| [20] | — | F | Yes | # of known functions | 200% (delay) |
| [21] | — | H | Yes | Hamming distance | 14% (wirelength) |
| This work | Any layer | F | Yes | # of wrong connections | 5.6% (wirelength) |

TABLE 1B

RELEVANCE TO RELATED WORK BASED ON [23]. "—" INDICATES THAT INFORMATION IS UNAVAILABLE. "H" AND "F" INDICATE APPLICABILITY TO HIERARCHICAL AND FLATTENED DESIGNS, RESPECTIVELY. (RES. MEANS RESILIENCY TO PROXIMITY ATTACK)

| Technique | Split layer | H/F | Res. | Security metric | Overhead |
|---|---|---|---|---|---|
| [9] | M4 | H | Yes | Hamming distance | 25% (delay) |
| [18] | M1 | F | Yes | # of known functions | 77% (area) |
| [10, 12, 14] | M1 | F | Yes | # of wrong connections | 5% (delay) |

TABLE 1B-continued

RELEVANCE TO RELATED WORK BASED ON [23].
"—" INDICATES THAT INFORMATION IS UNAVAILABLE.
"H" AND "F" INDICATE APPLICABILITY TO
HIERARCHICAL AND FLATTENED DESIGNS, RESPECTIVELY.
(RES. MEANS RESILIENCY TO PROXIMITY ATTACK)

| Technique | Split layer | H/F | Res. | Security metric | Overhead |
|---|---|---|---|---|---|
| [19] | — | F | Yes | # of known functions | 200% (delay) |
| [20] | — | H | Yes | Hamming distance | 14% (wirelength) |
| [23] | Any layer | F | Yes | # of correct connection error rate | 6% (wirelength) |
| This work | Any layer | F | Yes | Hamming distance # of incorrect connections | 3% (wirelength) 0.23% (Timing) |

Security-driven split manufacturing can also be embraced in 3D or 2.5D IC designs, where different die layers can be manufactured at different foundries, but this technique inherently assumes split manufacturing is secure. Circuit monitoring techniques can be used to enhance the security of split manufacturing. However, the proposed perturbation techniques do not need such circuitry as the security is ensured by design.

Most existing defense techniques assume that one can enhance security by splitting at M1. Unfortunately, this increases the cost of the BEOL foundry. If the BEOL foundry can manufacture certain lower metal layers (e.g., M2 and M3), the attacker in the FEOL foundry obtains less information about the design—only M1 and transistors. Unfortunately, in this case, the cost of owning and maintaining the BEOL foundry increases. If the BEOL foundry can manufacture only upper metal layers (e.g., M5 and above), the attacker in the FEOL foundry obtains more information about the design—M1-M4 and transistors. Although the cost of the BEOL foundry decreases in this case, it decreases security. Thus, one needs to find the optimal trade-off between security and capability/cost of the BEOL foundry. The perturbation techniques in the present disclosure can be compatible with any split layer.

IC camouflaging and logic encryption are other IP protection techniques. The former protects against malicious users, and the latter protects against both malicious users and foundries but requires secret key storage. Split manufacturing is an orthogonal technique that targets malicious foundries without the requirement of keys.

An attack for flattened designs can be utilized using a network-flow model. In addition to the proximity heuristic, the network-flow model considers load capacitance constraint and dangling wire hint. Hints for hierarchical designs cannot be used for flattened designs. A placement perturbation technique or another perturbation technique disclosed herein can be utilized to defend against proximity attack for flattened designs. The wire length can be optimized for overhead of the placement perturbation defense technique, though this approach can also optimize for other metrics such as power, delay, and wire congestion.

A network-flow based attack model can be performed that leverages common design conventions from industry-standard physical design tools geared towards industry-relevant flattened designs, experiments on ISCAS-85 benchmark circuits to demonstrate that the attack outperforms proximity attack for flattened designs by ~0.3×, a security-driven placement perturbation algorithm within Pareto optimization framework to ensure security while minimizing the overhead, and security assessment using ISCAS-85 benchmarks to show the effectiveness of the placement perturbation defense. The models can enable a designer to control security versus overhead trade-off.

In a common embodiment of split manufacturing, the FEOL layers can be manufactured by an offshore high-end foundry while BEOL manufacturing and the final integration can be conducted in a trusted foundry. The security risk in this scenario arises from the attacker in the offshore foundry.

The objective of the attacker is to retrieve the missing BEOL connections from the FEOL connections. Since the attacker is in the foundry, the attacker has access to the technology library. Consequently, the attacker can obtain the following information about logic gates: layout structure, delay, capacitance load, and wire capacitance. Based on this information, an attacker can reverse engineer the FEOL components and thereby obtain the incomplete gate-level netlist, which lacks the BEOL information. For this purpose, the attacker can use existing tools. The attacker neither knows the functionality implemented by the design nor has access to an IC that performs that function.

An attacker has the disadvantage that the solution space can be astronomically large. If k gate output pins miss their connections, there are 2 k possible connections in the worst case. An attacker can tremendously reduce this large solution space based on the knowledge that the designer used conventional physical design tools to design the target IC. An attacker can take advantage of the following hints, which are public knowledge.

Hint 1: Physical proximity. Physical design tools aim to minimize wire length, thereby improving performance and reducing power consumption.

Therefore, a connection between two pins is rarely very long. Hence, an attacker will prefer to connect two pins that are close to each other rather than the ones that are far apart.

Hint 2: Acyclic combinational logic circuit. With the exception of ring oscillators, flip-flops, and latches, combinational loops are rare in a design.

Hint 3: Load capacitance constraint. A gate can drive only a limited load capacitance to honor slew constraints. The maximum load capacitance of a gate can be obtained from the physical design library, which is public information. Hence, an attacker can limit consideration to only connections that will not violate the load capacitance constraints.

Hint 4: Directionality of dangling wires. Physical design tools route wires from a source gate to the sink node along the latter's direction. Hence, the directionality dangling wires at lower metal layers indicates the direction of their destination cell. An attacker can disregard components in the other directions.

Hint 5: If a connection violates the timing constraints, then this connection can be excluded. An attacker can at least obtain a conservative estimate on timing constraints through educated guess based on clock period.

Turning now to the drawings, exemplary embodiments are described in detail. With reference to FIG. 1, shown is a circuit 100 according to various embodiments of the present disclosure. The circuit 100 includes an FEOL metal layer 103. The FEOL metal layer 103 is a dangling metal pointing towards gate A 106 in the FEOL design available to an attacker. Intuitively, the missing upper metal is most likely to be connected with gate A instead of gate B 109. As an example, a BEOL metal layer applied to finish connecting the circuit 100 is more likely to couple between the FEOL metal layer 103 and the gate A 106 than the BEOL metal layer is to couple between the FEOL metal layer 103 and the gate B 109.

A type of attack, referred to as a greedy attack, mainly focuses on following the proximity hints (Hint 1) and the acyclic combinational logic hint (Hint 2). Unlike in hierarchical designs, where each missing net has only 2 pins, the net in flat designs may have multiple fanouts, i.e., more than 2 pins. In the greedy attack, a gate input pin can iteratively be connected to a nearest gate output pin. After each connection, a determination is made as to whether that connection results in a combinational loop. If a loop is found, this connection is reverted, the input pin is connected with the next nearest output pin that does not result in a combinational loop. This procedure is repeated until all gate input pins are connected. A dangling output can refer to an output of a gate that is not connected to any input. At the end, if there is a dangling output, a nearest multi-fanout net is found and the dangling output pin can be connected with the nearest input pin in this net.

Figure 2A:
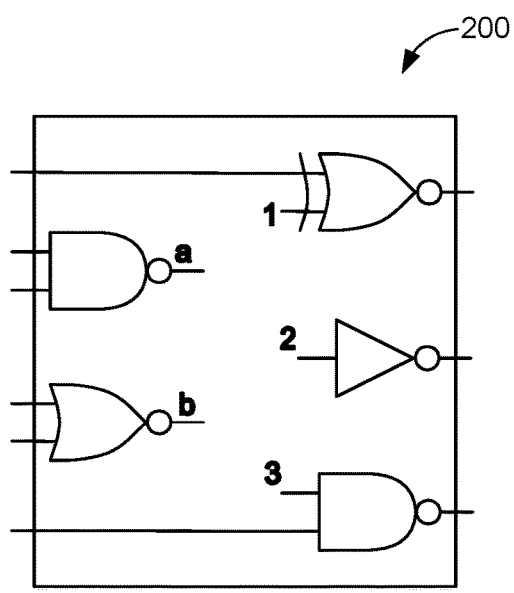
FIG. 2A is a schematic of a circuit according to various example embodiments.
Figure 2B:
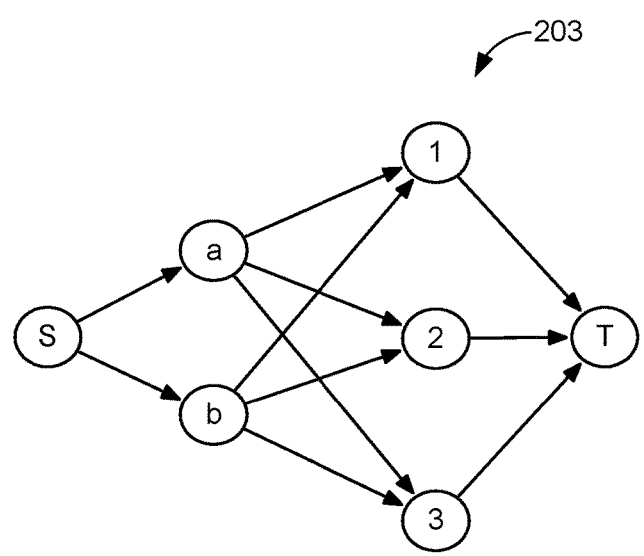
FIG. 2B is a network flow model of a circuit according to various example embodiments.

Another attack type is referred to as a network-flow attack. A network flow based attack framework can considers all the aforementioned hints (Hints 1-5) in a holistic manner. With reference to FIGS. 2A and 2B, shown is an example logic diagram 200 and a network 203 according to various embodiments of the present disclosure. The logic diagram 200 can have missing connections, such as, for example, from pin a and b to a respective one of pins 1, 2, and 3. The network 203 is for logic diagram 200. An attack of the logic diagram 200 needs to infer the connections between output pins {a, b} and input pins {1, 2, 3}.

The network 203 is a directed graph G=(V, E), where V is a set of vertices and E is a set of edges. The set V is composed by a set of vertices corresponding to the output pins ($V_o$), a set of vertices corresponding to the input pins ($V_i$), the source vertex (S) and the target vertex (T). The set E consists of $E_{So}$, edges from S to every output pin vertex, $E_{oi}$, edges from output pin vertices to input pin vertices, and ET, which includes edges from every input pin vertex to the target vertex. In a network flow solution, a certain amount of flow emerges from S, goes through network edges and finally arrives T. The flow through edge (a, i)∈$E_{oi}$ infers wire connection between output pin a and input pin i.

Figure 3:
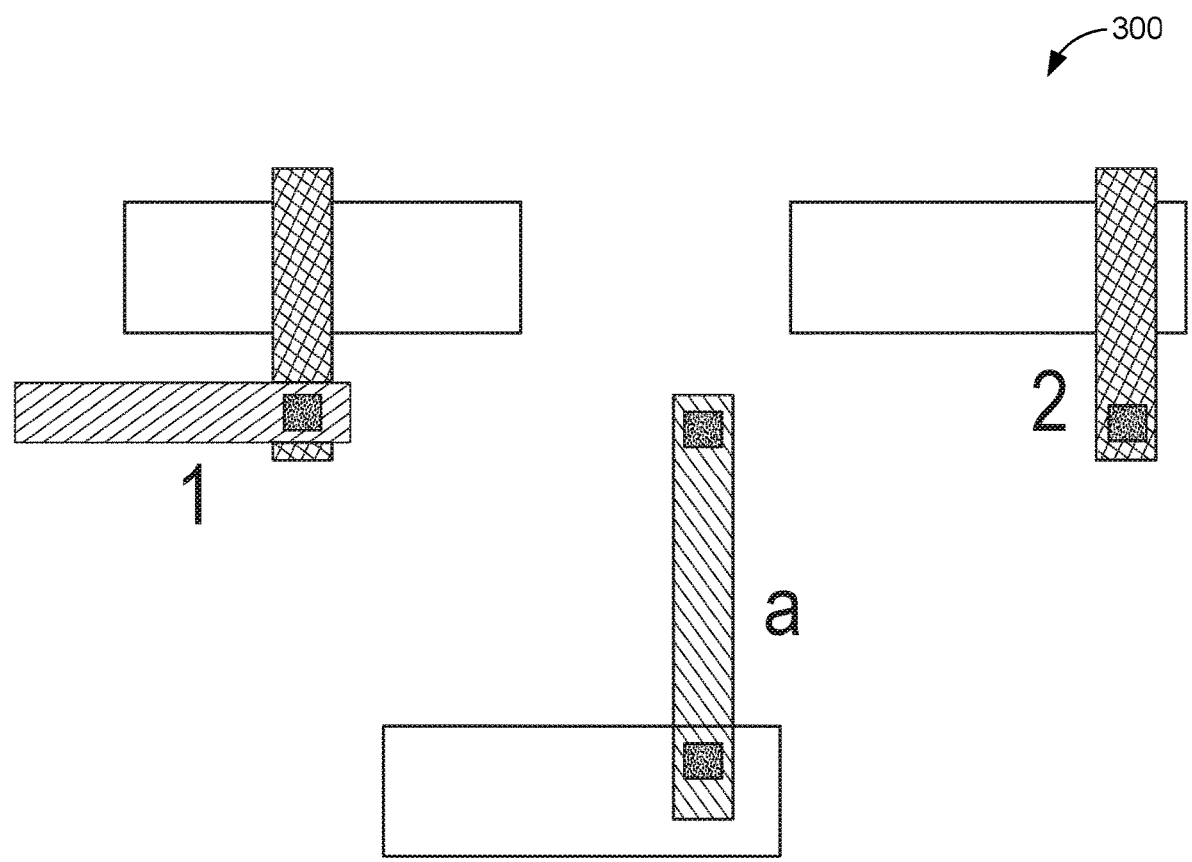
FIG. 3 is a layout of a circuit according to various example embodiments.

The five hints can be addressed by edge construction for $E_{oi}$, edge capacities, edge costs, and dynamic use of the network flow model. A necessary condition for including an edge (a, i)∈$E_{oi}$ is that output pin a is along the direction of input pin is dangling wire and vice-versa. With reference to FIG. 3, shown is a circuit layout 300 according to various embodiments of the present disclosure. The input pins 1 and 2 are in output pin a's dangling direction. Output pin a is in pin 2's dangling direction, but not in pin 1's dangling direction.

The edge (a, 2) is included in $E_{oi}$, but edge (a, 1) is not. Another condition is that the connection between a and i would not result in a timing violation. The slack at a can be estimated by subtracting the arrival time (AT) at a from the required arrival time (RAT) at i. An attacker can determine AT and RAT from the minimum operating frequency available in design specification. This is an optimistic estimation without considering the delay from a to i. If this optimistic slack is less than zero, then including the delay from a to i would make the violation even worse. Then, the connection between a and i is disallowed. As an example, there is no (a, i) in $E_{oi}$. When the AT and RAT are not available due to wire disconnections, then AT can be replaced with lower bound, which is the AT at the primary input, and RAT can be replaced with upper bound, which is the RAT at the primary output. The estimate obtained as such provides an upper bound for the slack. By constructing $E_{oi}$ as such, the hint of directionality of dangling wire (Hint 4) and timing constraints (Hint 5) are followed.

The capacity $c_{S,a}$ for each edge in $E_{So}$ can be defined as the load capacitance constraint for output pin a. The capacity $c_{a,i}$ for each edge in $E_{oi}$ can be infinity. The capacity $C_{i,T}$ for each edge in $E_{iT}$ is the input capacitance for pin i. A flow solution that satisfies the edge capacity constraints can follow the hint of load capacitance constraint (Hint 3).

The cost $w_{a,i}$ for each edge in $E_{oi}$ can be the wire length in connecting pin a and i. The other edge costs can be set to 0. If a min-cost flow algorithm is run on this network, the solution can minimize the total flow cost, which is the total wire length for all connections. This edge cost definition addresses the proximity hint (Hint 1).

The hint of acyclic combinational logic circuit (Hint 2) is difficult, if not impossible, to be handled in a one-shot network flow solution because a loop can be detected only after the connection solution is obtained. To solve this issue, an iterative network-flow approach can be used. After connections are inferred from a network flow solution, a circuit traversal can be performed to check if any loop exists. If so, the longest inferred connection can be selected. This connection can correspond to an edge in $E_{oi}$. Then, this edge can be removed from the network, and the min-cost flow algorithm can be conducted again. This procedure can be repeated until no loop is detected. In the min-cost network flow problem, the decision variables can be the flow $x_{i,j}$ going through each edge (i,j)∈E.

The problem can be formulated as follows.

$$\text{Min} \Sigma_{(i,j) \in E} \omega_{i,j} \cdot x_{i,j} \quad (1)$$

$$s.t. \Sigma_{i|(i,j) \in E} x_{i,j} = \Sigma_{k|(j,k) \in E} x_{j,k}, \ j \in V_o \cup V_i \quad (2)$$

$$\Sigma_{(i,T) \in E_{iT}} x_{i,T} = \Sigma_{(i,T) \in E_{iT}} c_{i,T} \quad (3)$$

$$\Sigma_{(S,i) \in E_{So}} x_{S,i} = \Sigma_{(i,T) \in E_{iT}} c_{i,T} \quad (4)$$

$$x_{i,j} \le c_{i,j}, \ \forall (i,j) \in E \quad (5)$$

This problem can be solved by off-the-shelf algorithms, e.g., the Edmonds-Karp algorithm, which can obtain the optimal solution in polynomial time.

Figure 4B:
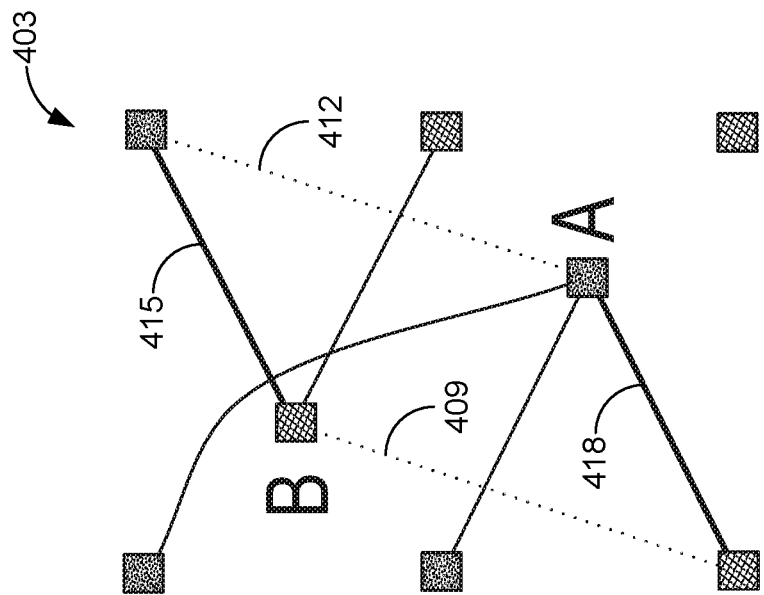
Figure 4A:
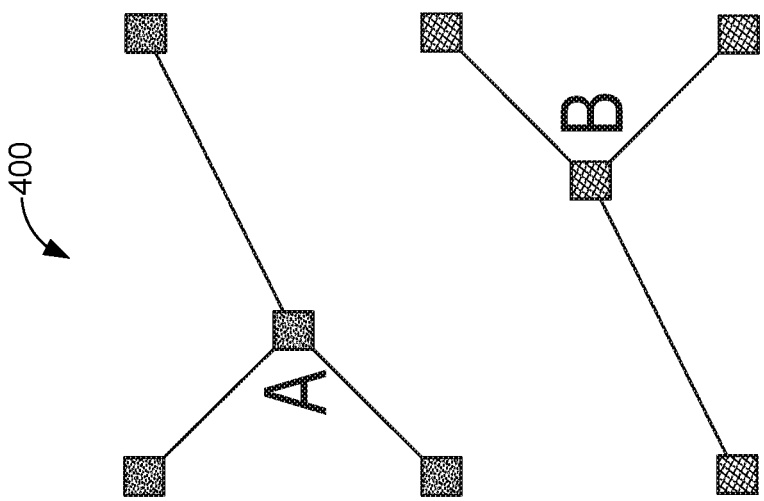

With reference to FIG. 4A-C shown are layouts of logic gates 400, 403, and 406 according to various embodiments of the present disclosure. A placement perturbation based defense can prevent attacks by moving the position of one or more gates. To develop provably-secure split manufacturing, the physical design techniques can be reinforced with security. Unfortunately, such approaches may have high overhead. Hence, the placement perturbation defense can include explicitly optimizing the overhead. This placement perturbation techniques can be used with conventional physical design tools.

The layout 400 can represent an original layout, such as, for example, a layout output from a physical design tool. The layout 403 can represent an example layout 400 after swapping gate A and B. The layout 403 can correspond to layout 400 after pinswapping is performed. The wires 409 and 412 are wires missing to attackers. The wires 415 and 418 correspond to connections that would be created during an attack. By using the proximity hint, an attack may restore the connection as the red lines, which are wrong. Thus, the swapping indeed improves security. However, it increases wire length by 70%, which is quite significant.

The layout 406 can represent another example layout 400 after a smaller perturbation to A and B to thwart attacks. Placement perturbations can be made to gates A and B, which can also lead to attack failures. The wires 409a and 412a are wires missing to attackers, and the wires 415 and 418 are connections that would be created during an attack. The wire length increase in layout 406 is 30% and less than that in layout 403. In placement perturbation, one aim is to secure a design with minimum overhead.

Given a circuit design after global routing and wire layer assignment, gate locations can be changed such that the proximity hint is no longer effective. The perturbation may affect the conventional design objectives such as wire length, timing, and power. Thus, the overhead needs to be minimized. A tree can be iteratively extracted from a circuit. The locations of the gates in the each extracted tree can be perturbed. In some embodiments, a Pareto optimization based perturbation algorithm can be used. One reason to extract a tree topology is because of its compatibility with the Pareto optimization based perturbation algorithm.

The tree extraction can involve several principles. One such principle is that the tree extraction should overlap with the missing wires, i.e., upper metal wires. Another such principle is that, if a gate has been perturbed in previous iterations, the previously perturbed gate is no longer included in a newly extracted tree. The input to the placement perturbation can contain wire layer assignment information. If a gate has fanin nets on upper metal layers, the tree root can be extracted. From the root gate, the extraction can proceed with reverse topological traversal. A gate can be included into the tree traversal as long as the tree topology can be maintained. The traversal/extraction can terminate at the primary input pins.

For each extracted tree, one or more gate locations can be perturbed using a Pareto optimization approach. The procedure can be a bottom-up procedure from the leaf nodes to the root node of the tree. At a leaf gate gi, the location can be varied to obtain a set of candidate solutions. The candidate location can be checked to ensure the empty space can accommodate the gate. Then, the candidate solutions at leaf nodes can be propagated toward their parent nodes and merged there.

Each candidate solution can be evaluated by a wire length overhead and a perturbation metric of the candidate solution. The perturbation metric can dictate the placement difference from the original layout with consideration of security. A placement can have multiple underlying factors. One of the underlying factors is the spatial order, e.g., a gate is to the left or right of another gate. Another underlying factor is a distance between gates or pins. From the security point of view, a relatively large pin distance in a net can imply a large solution space for the attacker. A spatial order change can be a more disruptive perturbation to the original design. The spatial order change can enhance security considering that the spatial order in the original layout can be highly optimized by conventional placement tools.

Figure 5A:
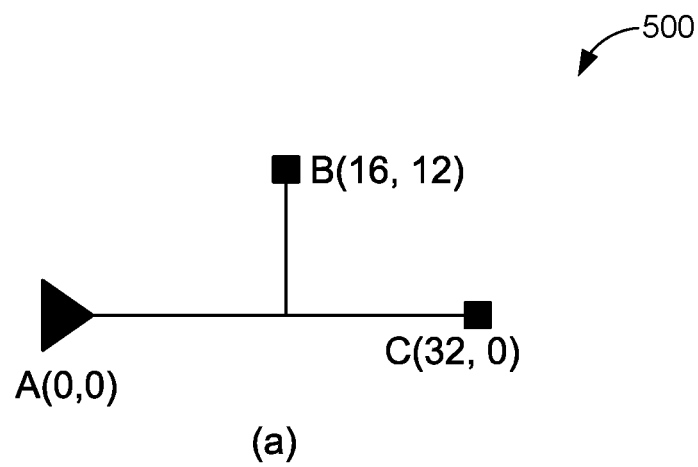
FIGS. 5A and 5B are layouts of example circuits according to various example embodiments.
Figure 5B:
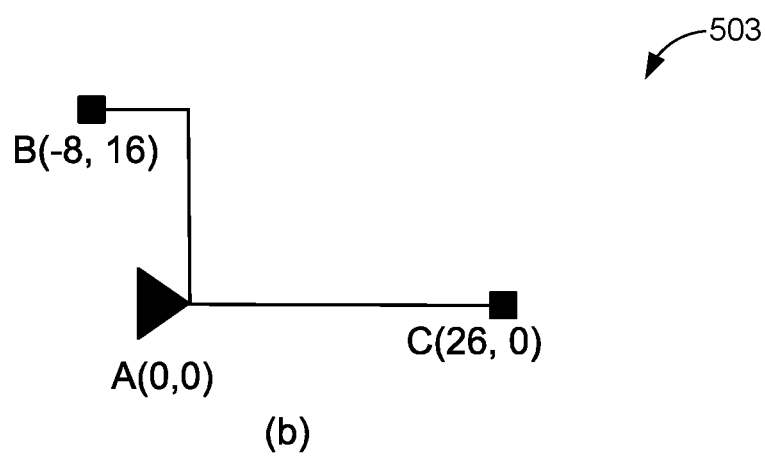

With reference to FIGS. 5A and 5B, shown is a layout 500 and a layout 503 according to various embodiments of the present disclosure. The layout 500 can correspond to an original layout, such as, for example, a layout generated by a physical design tool. The layout 503 can correspond to layout 500 after a perturbation. The numbers shown in FIGS. 5A and 5B can indicate example X-Y coordinates of the games A, B, and C within the layout 500 and 503 respectively. Based on these rationale, a perturbation metric can be developed based on the example layouts 500 and 503. First, each source-sink pair along one axis can be considered. For source A and sink B along y-axis, the perturbation $\pi_{A,B}^y=4$ can be used as the distance is increased from 12 to 16. Along the x-axis, the spatial order between A and B can be flipped. Thus, the distance change can be scaled with gain factor, e.g., 2. Hence, $\pi_{A,B}^x=2*|-8-16|=48$. For source A and sink C, there is no spatial order change and the distance is decreased. Since such distance decrease does not change the proximity of gates, its effect is nullified in the perturbation $\pi_{A,C}^x=0*|26-32|=0$. The overall perturbation for this net is the summation of all these factors: $\pi_A=\pi_{A,B}^y+\pi_{A,B}^x+\pi_{A,C}^x=54$. In general, a solution with a large perturbation is more difficult to attack.

Each candidate solution $\psi_i$ is characterized by its wire length $\omega_i$ and perturbation $\pi_i$. Although the perturbation increases wire length, perturbation and wire length are not perfectly correlated. For the example in FIGS. 5A and 5B, the perturbation according to the metric is 54, while the wire length increase is only 6. To avoid enumerating all cases like in brute force approach, some inferior candidate solutions can be pruned out without further propagation. As an example, for two solutions, $\psi_i$ and $\psi_j$, $\psi_i$ is inferior if $\omega_i \geq \omega_j$ and $\pi_i \leq \pi_j$. At the root node, a solution with the maximum perturbation and a wire length that increases no more than $\alpha\%$ can be selected, where $\alpha$ is a given budget. The pseudo code of the defense algorithm is shown below. Without loss of generality, an assumption can be made that the tree is binary. If a tree is not binary, the tree can be converted to one by inserting pseudo nodes.

ALGORITHM 1

Placement perturbation based defense

```
Input   : Tree extracted from layout
          wirelength increase budget α
Output: Location of each gate in tree
1   w_ini ← wirelength of the original tree;
2   Initialize every fanin v_i of all tree leaf nodes with solution
    (w_i = 0, π_i = 0);
3   for each gate v_i in the tree in topological order do
4   |  if v_i has fanin then
5   |  |  if v_i has 2 fanin v_j and v_k then
6   |  |  |  S ← ∅;
7   |  |  |  for each solution s_j from v_j and s_k from v_k do
8   |  |  |  |  S ← {(w_j + w_k, π_j + π_k)} ∪ S;
9   |  |  |  end
10  |  |  end
11  |  else
12  |  |  if v_i has 1 fanin v_j then
13  |  |  |  S ← Solutions from v_j;
14  |  |  end
15  |  end
16  |  end
17  |  S_i ← ∅;
18  |  for each candidate location (x_k, y_k) do
19  |  |  Temporarily place v_i at (x_k, y_k);
20  |  |  S_{i,k} ← ∅;
21  |  |  for each solution s_j in S do
22  |  |  |  Obtain w_k based on (x_k, y_k) and s_j;
23  |  |  |  Obtain π_k based on (x_k, y_k) and s_j;
24  |  |  |  S_{i,k} ← {(w_k, π_k)} ∪ S_{i,k};
```

ALGORITHM 1-continued

Placement perturbation based defense

```
25  |   |  end
26  |   |  Prune S_{i,k} ;
27  |   |  S_i ← S_i ∪ S_{ik};
28  |   end
29  end
30  S_{root} ← Solutions at the root gate;
31  Find s_i ∈ S_{root} that has max π_j and w_i ≤ (1 + α%) · w_{ini};
32  Return Location of each gate in tree according to s_i;
33  ─────────────────────────────────────────────
```

According to one evaluation, the disclosed techniques were evaluated using ISCAS-85 combinational benchmark circuits. Each circuit was synthesized by Synopsys Design Compiler tool. Placement and routing were performed using Cadence SoC Encounter tool for 45 nm CMOS technology. The effectiveness of the attack model was accessed by identifying the number of correct connections it makes. An assumption is made that an attacker always tries to make as many correct connections as possible. In order to prevent an attacker from reconstructing the design correctly, the defender perturbs a threshold number of gates in the design, while minimizing the overhead. The overhead can be measured in terms of wire length, which may affect delay, power, and congestion. In addition, the performance of attack and defense techniques can be evaluated through error rate. The error rate can be measured as the number of wrong outputs produced on applying a specific number of inputs. One objective of the defender is to ensure that the recovered design has a high error rate through placement perturbation. Contrarily, one objective of the attacker can be to minimize the error rate of the recovered design. The error rate between the outputs of the original design and the design reconstructed using the attack was determined by applying 50,000 random input patterns.

Figure 6:
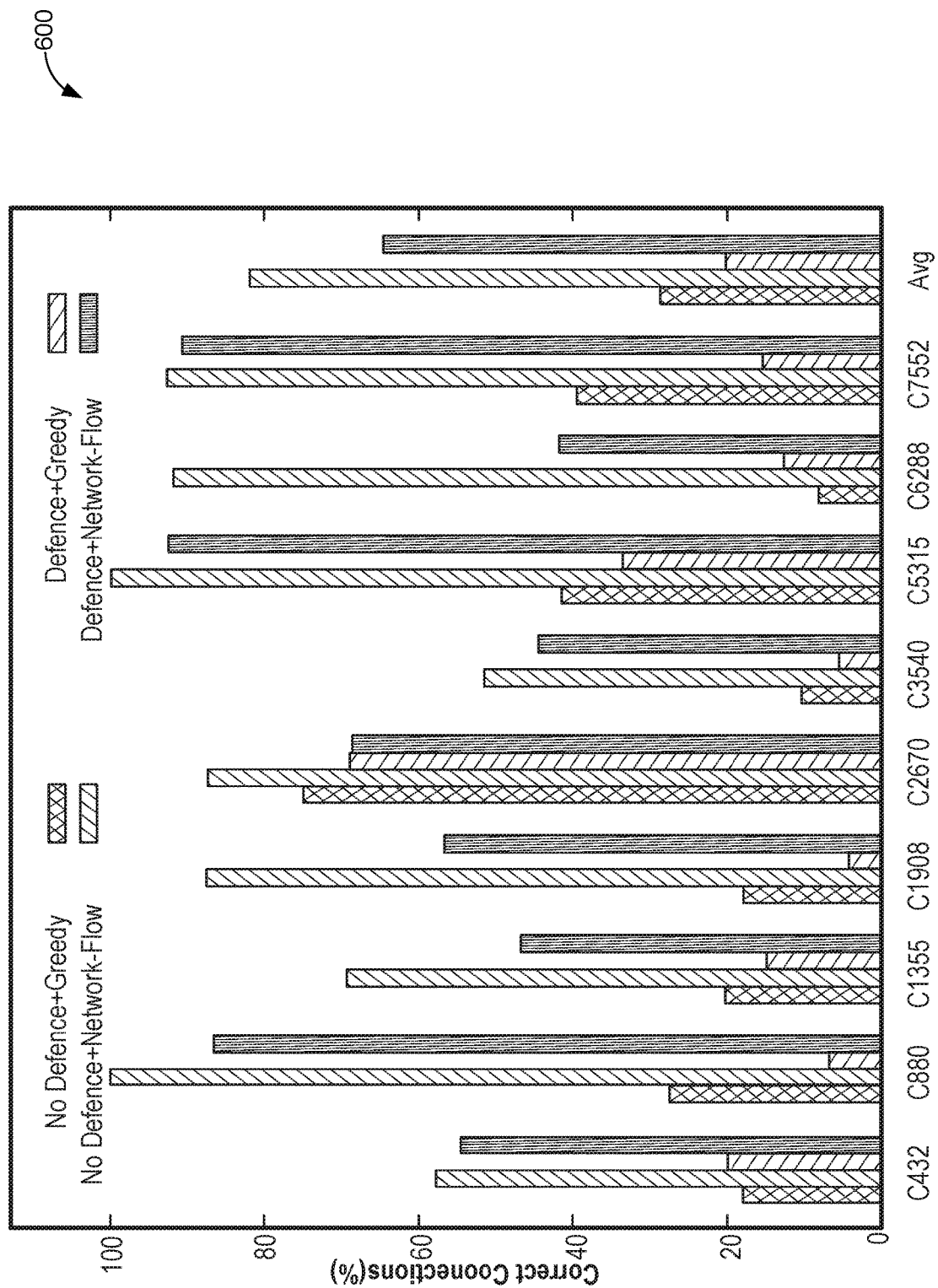
FIG. 6 is a graph of a percentage of correct connections for a network-flow model based attack according to various embodiments of the present disclosure.

With reference to FIG. 6, shown is a graph 600 according to various embodiments of the present disclosure. For each benchmark circuit, several configurations were analyzed. The configurations include "No defense+Greedy attack," "No defense+Network-flow attack," "Defense+Greedy attack," and "Defense+Network-flow attack," respectively. For this experiment, the wire length overhead threshold was set to be 510%. The graph 600 shows the percentage of pins that are correctly connected by an attacker using greedy attack and the proposed network-flow based attack. In case of "No defense+Greedy attack," the average number of correct connections is only 28.55%, lower than that of "No defense+Network-flow attack." This verifies that the greedy attack is not applicable to flattened designs while network-flow attack is effective.

Meanwhile, for each benchmark circuit, the correct connection rate of "Defense+Network-flow attack" is always less than that of "No defense+Network-flow attack." The lower connection rates can demonstrate that the proposed defense technique can efficiently protect the design, even when network-flow attack is used. Even though "Defense+Network-flow attack" has a lower correct connection rate than that of "No defense+Network-flow attack," the correct connection rate is still not 0%, which is the ideal value for defense. The correct connection rate is over 0% because of a constraint restricting the wire length overhead to 10%.

Figure 7:
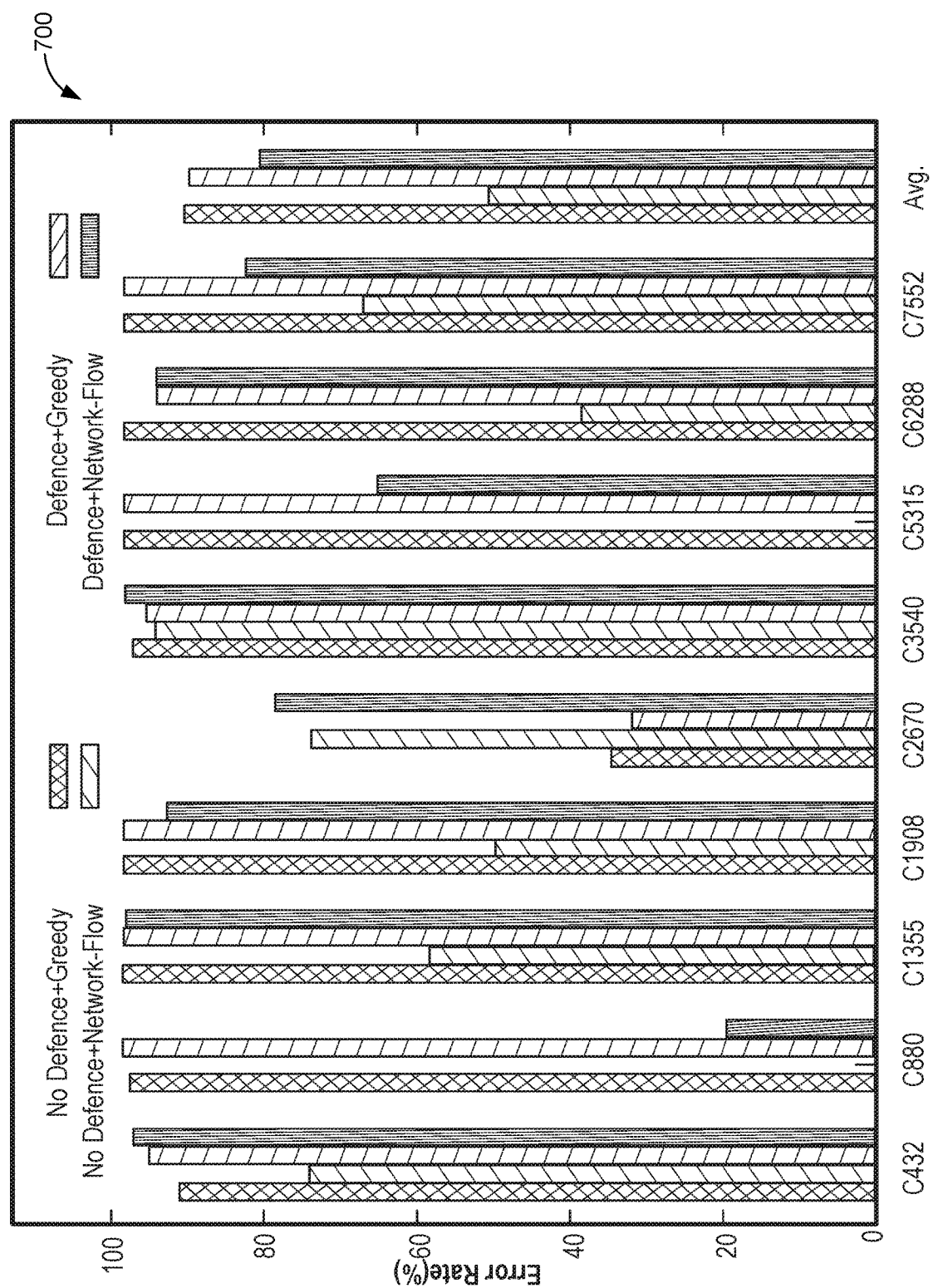
FIG. 7 is a graph of a percentage of errors rate on performing a greedy attack and a network-flow model based attack according to various embodiments of the present disclosure.

With reference to FIG. 7, shown is a graph 700 according to various embodiments of the present disclosure. The graph 700 depicts the error rate of primary output ports between the original design and the design subject to different attack and defense techniques. The error rate of "No defense+Greedy attack" is greater than that of "No defense+Network-flow attack," highlighting the effectiveness of the proposed network-flow attack. In addition, the error rate of "Defense+Network-flow attack" is greater than that of "No defense+Network-flow attack," highlighting the effectiveness of the proposed placement perturbation defense. Once again, the placement perturbation defense technique did not achieve the ideal error rate of 100% because the wire length overhead was constrained to 10%. A higher wire length overhead threshold can cause a higher error rate while a lower wire length overhead threshold can cause a lower error rate. In some embodiments, a wire length threshold can be adjusted to ensure an error rate exceeds a threshold level for both the network-flow attack and the greedy attack.

A low correct connection rate resulted in a high error rate except for c2670. In c2670, both the correct connection rate and error rate of "No defense+Network-flow attack" were higher than those of "No defense+Greedy attack." These higher rates can be because the numerous disconnected pins that are incorrectly connected by an attacker can propagate to the same output. In consequence, "No defense+Greedy attack" possessed more wrong connections but less wrong outputs.

TABLE 2

Wirelength overhead in % on incorporating the proposed defense technique. "Avg." indicates the average.

| | Benchmark | | | | |
|---|---|---|---|---|---|
| | C432 | C880 | C1355 | C1908 | C2670 |
| Overhead (%) | 4.5 | 9 | 3.7 | 10 | 6.2 |
| | Benchmark | | | | |
| | C3510 | C5315 | C6288 | C7522 | Avg. |
| Overhead (%) | 4.8 | 2.4 | 5 | 4.5 | 5.6 |

Even though the maximum wire length was restricted to a maximum overhead of 10% for the placement perturbation defense technique, the actual overhead may not necessarily be 10%. Table 2 lists the actual wire length overhead on performing "Defense+Network-flow attack" shown in FIGS. 6 and 7. The actual overhead was not 10% because the correct connection and error rates achieved by the design did not decrease and increase, respectively, beyond the values listed in Table 2; the actual overhead gets better only when the overhead is ≥10%, which is not allowed in our experiment.

Figure 8:
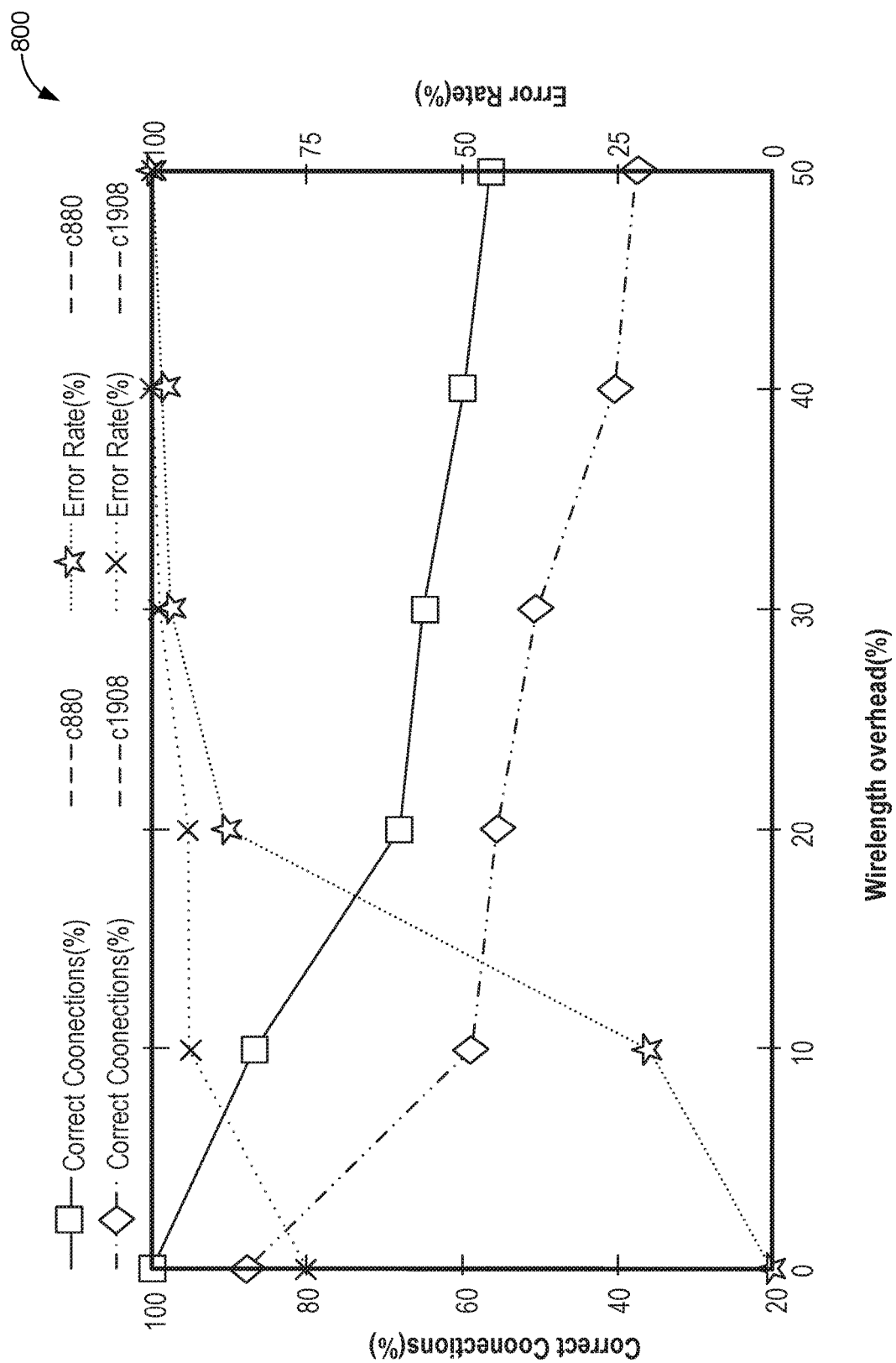
FIG. 8 is a graph illustrating security verses overhead trade-off according to various embodiments of the present disclosure.
Figure 9A:
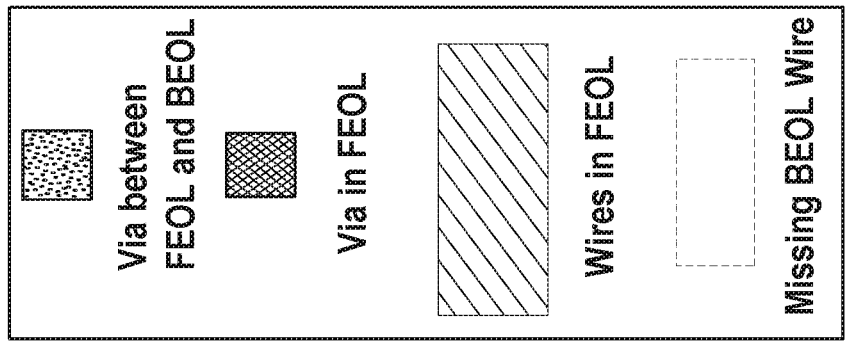
FIGS. 9A-9C are layouts of example circuits according to various example embodiments.
Figure 9A:
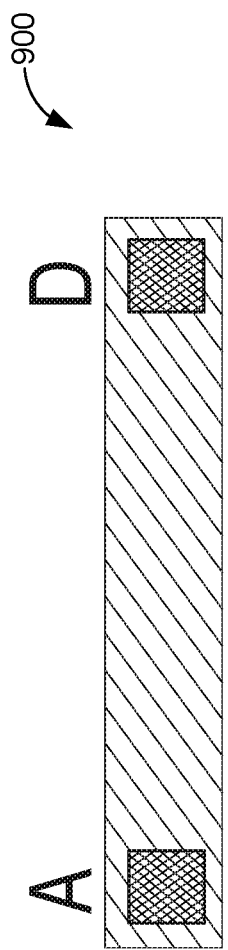
Figure 9B:
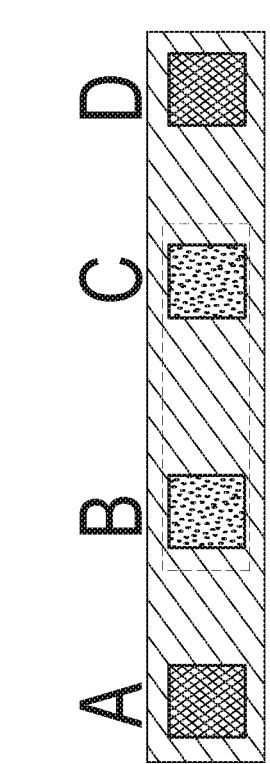
Figure 9C:
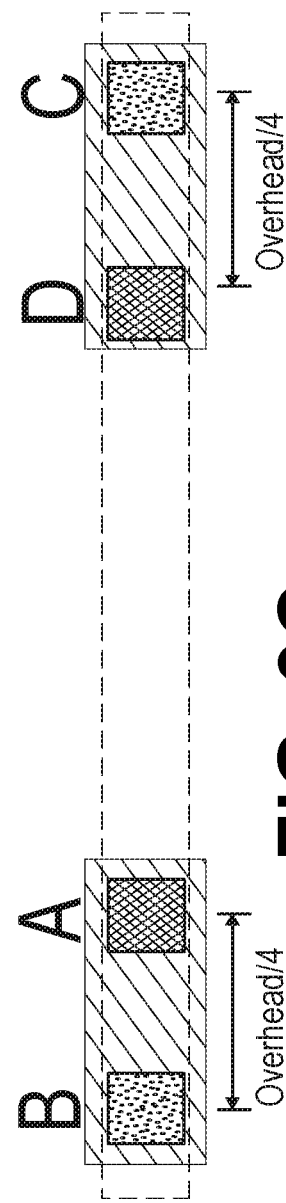
Figure 10A:
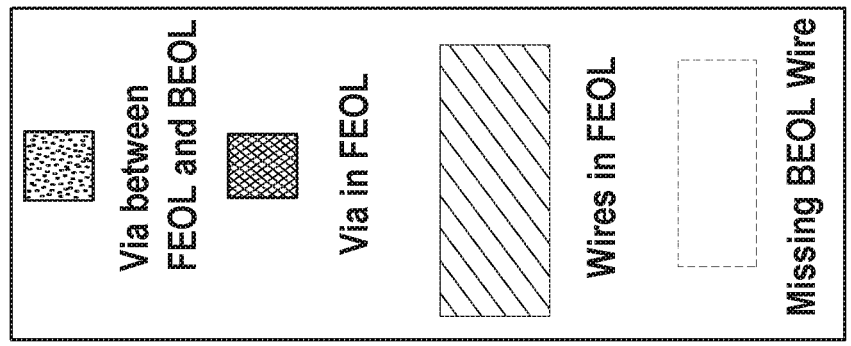
FIGS. 10A and 10B are layouts of example circuits according to various example embodiments.
Figure 10B:
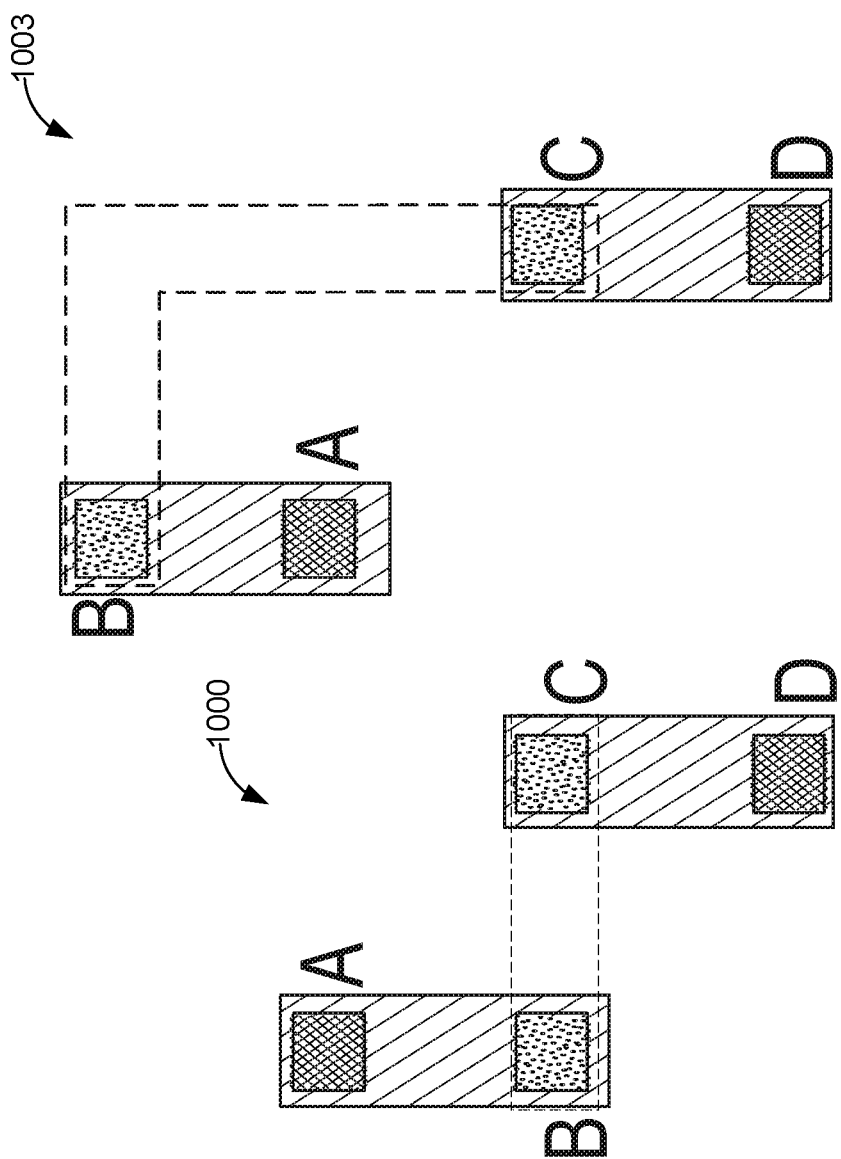

With reference to FIG. 8, shown is a graph 800 according to various embodiments of the present disclosure. The graph 800 shows the maximum achievable correction connection rate and minimum error rate for c880 and c1908 on allowing different wire length overhead. In case of c880 and c1908, the correct connection rate did not decrease to 0% even after increasing the wire length overhead to 50%, because these designs have multi-fan-out pins. While it is easy for an attacker to determine the multi-fan-out pins due to their dangling nature, perturbing them increases the overhead. However, the error rate reached 100% when the maximum allowable wire length overhead is 50%. Thus, a defender does not need to perturb all the gates to achieve 100% error rate because each output port can be affected by two or more pins, and as such, perturbing one of them may be sufficient to cause an error at that output port.

TABLE 3

Effect of split layer on the proposed attack in c880 and c1908. The design with no defense is subject to network-flow based attack.

| Benchmark | | Split layer | | | |
|---|---|---|---|---|---|
| | | 3 | 4 | 5 | 6 |
| c880 | Correct connections (%) | 27.06 | 56.67 | 100 | 100 |
| | Error rate (%) | 100 | 97.54 | 0 | 0 |
| c1908 | Correct connections (%) | 29.4 | 87.72 | 100 | 100 |
| | Error rate (%) | 100 | 50.72 | 0 | 0 |

The layer at which the BEOL and FEOL split occurs is called the split layer. If the split layer is M2 or M3, it may guarantee security, but it demands a relatively high end BEOL facility, and thus increases costs. Contrarily, if the split layer is M5 or M6, it may not guarantee security, but it does not demand a relatively high-end BEOL facility, and thus decreases the cost. Thus, it is necessary to find the effect of the location of the split layer on the proposed attack. Table 3 lists the effectiveness of an attack for different split layers. Table 3 illustrates that when M5 or M6 is the split layer, the proposed attack is highly effective because there are a smaller number of candidate solutions. Further, Table 3 illustrates that when M3 or M4 is the split layer, the proposed attack is ineffective because there are a greater number of candidate solutions.

The greedy attack has a correct connection rate of 28%. The proposed network-flow attack has almost tripled this rate to 82%. This is still not 100%, even though our attack deduces all the connections in c880 and c5315. This rate can be further increased by using hints at the logic level. Only the physical design heuristics were considered to determine the 82%. An optimization can be performed for other security metrics, e.g. Hamming distance. A number of wrong connections and the error rate were chosen to measure the effectiveness of the network-flow attack and the placement perturbation defense technique because those metrics are the most commonly used metrics. However, researchers have also used another metric including Hamming distance between the outputs of the original design and the design recovered by the attack, which can also be used to quantify the network-flow attack and placement perturbation defense. Furthermore, the placement perturbation defense framework can be amenable to incorporate controllability and observability metrics into account. For instance, in Algorithm 1, one can assign weights based on move distance, observability, controllability, or a combination thereof.

It was assumed that the attacker does not know the functionality implemented by the target design. In an orthogonal threat model, an attacker knows the functionality implemented by the design, and the attacker tries to identify "safe places" to insert Trojans. The disclosed framework can be adapted to this threat model. The Pareto optimization approach can include identifying which wires to "lift" to the BEOL connection such that it meets the required security level, while minimizing overhead. The run-time for a network-flow attack can be $O(V^2 * E^2)$, where V is the number of disconnected BEOL pins and E is the number of wires. The complexity of Edmonds-Karp algorithm is $O(V * E^2)$. In a worst case scenario, this algorithm is executed V times.

Next, a routing perturbation algorithm is discussed according to various embodiments of the present disclosure. The routing perturbation algorithm can be developed to defend against proximity attack for flattened designs. Techniques for a routing perturbation include layer elevation, detour, decoy, and testing principles, among others. The layer elevation can involve selective wire segments being moved from the FEOL layers to the BEOL layers. By moving the selective wire segments, the moved segments are hidden from the attackers. The detour technique involves elevated wires being rerouted to defeat proximity attacks. The decoy technique involves an unconnected pin arising from the ripping up being moved near to multiple unconnected pins of other nets. The testing principles technique can include wires to be detoured and decoyed being selected based on IC testing principles. The wire length overhead of our defense techniques can be optimized, though this approach can also optimize for other metrics such as power, delay, and wire congestion.

A security-driven routing perturbation algorithm can ensure security while minimizing the overhead that is applicable to industry-relevant flattened designs. A perturbation defense algorithm can use a combination of physical design principles and IC testing principles to achieve a trade-off between security and overhead. Security assessment can be performed using ISCAS'85 and ITC'99 benchmarks to show the effectiveness of the defense. According to some embodiments, the experimental results indicate that the disclosed method can restrict wire length overhead to be 3% on average. The timing overhead can also be negligible. The defense algorithms can be compatibility with industry-standard tools and physical design flow.

For attackers in the FEOL foundry, BEOL layout information is not available. If some wire connections are moved from FEOL metal layers to BEOL layers, the wire connections can become invisible to attackers, and therefore, the difficulty of attack can be increased. If there are m 2-pin nets in BEOL, there are m! source-sink combinations for an attacker to explore. Hence, the solution space for an attacker is exponential with respect to the number of nets in the BEOL layers. With reference to FIGS. 1A-1C, shown are layouts 900, 903, and 909 according to various embodiments of the present disclosure. In layout 900, the wire connection between gates A and D is at a low metal layer. In layout 903, a segment of this wire is moved to a BEOL metal layer. Of course, when some wires are moved to BEOL layers, the BEOL layer can be checked to ensure the BEOL layers are not too crowded and the delay overhead caused by the vias is limited. Layer elevation alone may not be sufficient, as an attacker may restore the connection according to pin proximity. Hence, the layer elevation technique can be combined along with other techniques such as wire detour, as demonstrated in layout 906.

With reference to FIGS. 2A and 2B, shown are layouts 1000 and 1003 according to various embodiments of the present disclosure. The proximity attack is mainly based on the following objective of the physical design tools: a wiring route connecting two pins is normally the shortest path as long as the routing space allows. In the layout 1000, a routing path starts from pin A, goes through the FEOL layers to point B, switches to a BEOL layer, and then connects to another pin C. An attacker can determine the wire segments from A to B and from C to D, but not the one from B to C. However, the dangling wire A-B in layout 1000 provides a very helpful hint to attackers. If pin C is to the southeast of pin A, the path from A to B also most probably points to the direction of southeast. It can be noted that point B is a Steiner node and not a terminal pin. If we move point B to the north of pin A using a detour perturbation technique, an attacker would be misled to think that pin A should be connected with another pin north of pin A, as shown in layout 1003. The intentional detouring of wires can invalidate the basis of proximity attacks. The detour perturbation technique causes wire length overhead. Therefore, the detour perturbation technique needs to be applied in a judicious manner.

Sometimes merely violating design convention is not sufficient to thwart the attacks. For the example in FIG. 2B, even after moving point B to the north, the nearest unconnected pin is still C, and an attacker would connect B with C. This situation can be avoided by further changing the location of B, or changing the length of segment AB. A search can be performed for a location of B such that there are several unconnected pins nearby and the correct connection becomes less obvious.

Figure 11:
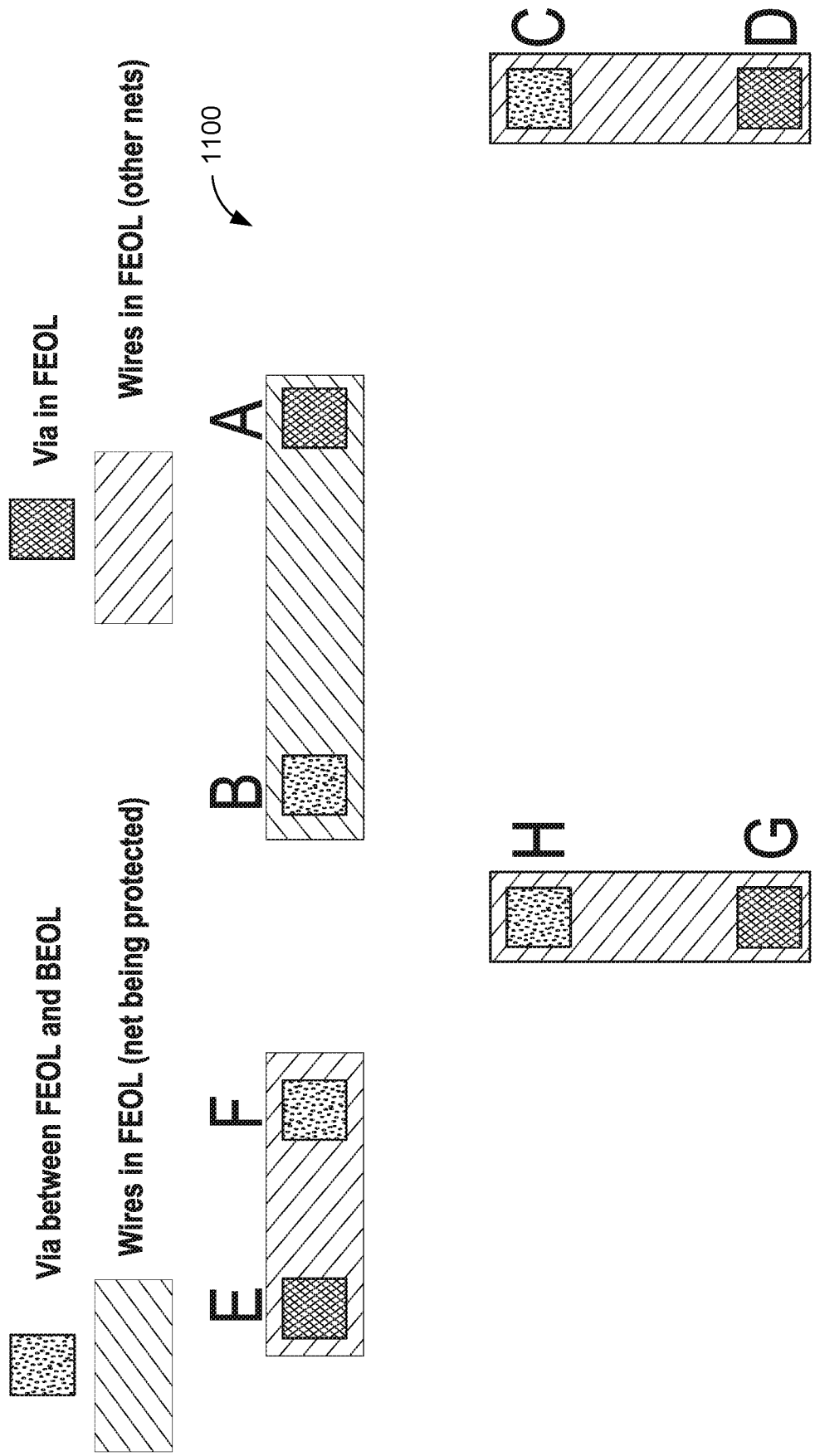
FIG. 11 is a layout of a circuit according to various example embodiments.

With reference to FIG. 11, shown is a layout 1100 according to various embodiments of the present disclosure. The unconnected pins of the other nets serve as decoys to the net of ABC. At the same time, point B can play a role of decoy to other unconnected pins. For example, net ABC in layout 1100 is the same as net ABC in layouts 1000 and 1003. In layout 1100, B is moved to west of A, where two unconnected pins F and H of other nets are nearby using a decoy perturbation technique. Pin B is closer to F and H than to C. As such, an attacker will most likely connect B with F or H instead of C.

The aforementioned perturbation techniques are about how to perturb the routing for a net so the proximity attack principles are defied. All these perturbation techniques incur overhead, and hence, the selection of perturbation techniques can involve carefully selecting which nets to be perturbed. Ideally, the overhead of perturbation can be minimized while the "damage" to the attacker is maximized. The "damage" can be quantified through a security metric. In case of split manufacturing, the Hamming distance can be used as a security metric, among other security metrics. The security metric can involve a Hamming distance between the outputs of the original design and the design where the missing BEOL connections are determined by the attacker. The term "Hamming distance" is used herein; however, the term is intended to include other types of security metrics.

To reduce the overhead of perturbation, the wires can be selected to maximize Hamming distance. VLSI testing principles can be utilized for this purpose. Ideally, a computing device can trace the probability that a logic fault due to connection error is propagated to the primary outputs. However, this probability usually depends on the overall structure of a circuit restored by an attacker, which may contain multiple connection errors. It can be difficult for the defense at design time to predict the attack result. In fact, the simulation complexity increases exponentially with the number of missing BEOL connections, making it impractical.

To enable a faster computing time, fault observability can be used, as defined in SCOAP, as a surrogate metric. The computation time of SCOAP observability metric is linear in the number of gates in the design, making it easy to adopt. A two-tier approach can be used. As a first tier, if a net has high observability, an error of the net is more likely to be propagated to the primary output. Hence, nets with high observability for layer perturbation can be selected to reduce the overhead. As a second tier, in case of decoy connections, the wires can be selected as decoys for the wires selected in the previous step. The logic difference can be examined between a pin to the pins decoy net and strive to find a decoy net that maximizes the Hamming distance. The logic difference can be obtained by running Monte Carlo logic simulations.

Taking a circuit design with layout, a computing device can select a set of nets, rip up a part of wire connections for the nets, make some changes to the remaining wires in the nets, and then reroute the wires being ripped up. According to one embodiment, five phases can be defined; however, more or less phases can be used. Global nets can be used to refer those nets that have wires in BEOL layers in the original design. Likewise, local net can refer to a net with all of its wires in the FEOL layers.

A first phase can include ripping up global wire segments. For a global net Ni, which has wires in BEOL layers, a general case is that it has two via nodes B and C connecting wires across the FEOL and BEOL layers, as shown in layout 900. Without loss of generality, let us assume node B is closer to the driver and C is closer to a sink of this net. Then, the wire segment between B and C is in the BEOL layers, while the wires from the driver to B and from C to the sink are in the FEOL layers. For some global nets, the BEOL wire between B and C can be ripped up. Via nodes B and C can be called pseudo pins, which can be moved in later phases. In the last phase, the pseudo pins can be reconnected through wires in the BEOL layers. Among the global nets, a subset $N_{G,R}$ can be chosen to be ripped up. The selection can be to find those nets whose connection errors may lead to large circuit output errors. All global nets can be sorted in non-decreasing order of the SCOAP observability, and then the top $\rho_G$ percent of the nets into $N_{G,R}$ can be selected to be ripped up. The ρG can be a parameter controlling the wire length overhead. Once a net has its BEOL wire being ripped up, it is subject to other perturbation defense techniques such as detour and decoy, both of which usually increase wire length.

A second phase can include ripping up local nets and generating pseudo pins. In this phase, a set of candidate local nets $N_L$ can be identified. Potentially, these nets will have wire ripping up similar to the global wires in Phase I. As they are local nets, the wires being ripped up can be in the FEOL layers. In later phases, the rerouting for these wires can go through the BEOL layers. This is similar to the wire segment between a and b in layout 903, which is changed to upper layers, i.e., a layer elevation perturbation technique is performed. The candidate nets in $N_L$ can the following properties: 1. For a wire segment $\omega_{ij}$ in a net $N_i \in N_L$, there exists some empty space in the BEOL layer and via space such that $\omega_{ij}$ can be moved to the BEOL layer. 2. The layout can have wires in the topmost FEOL metal layers. For example, if the boundary between FEOL and BEOL layers is between metal 4 and metal 5, a net $N_i \in N_L$ must have at least one wire segment $\omega_{ij}$ in metal 3 or 4 in the original layout design.

Property 1 can be used to ensure that the layer elevation for such wire $\omega_{ij}$ is feasible. Property 2 can be used to attempt to minimize the number of layer changes so that the impact to the original design is minimized. In general, wires of different metal layers can have different dimension and parasitics while the parasitics of adjacent layers can be close to each other. Similar to Phase I, the nets in $N_L$ are sorted in non-decreasing order of the SCOAP observability. Then, the top ρL % of them can be selected for ripping up. In ripping up net $N_i \in N_L$, two pseudo pins a and b can first be inserted in a wires segment $\omega_{ij} \in N_i$, which can be in the topmost FEOL layers, like in layout 903. Then, the wire between a and b can be ripped up. The exact choice of a and b is not important, as the locations of a and b can be changed in later phases. The wire opening between a and b can be reconnected back later using the BEOL layers.

A third phase can include performing a driver side detour perturbation. The set of all nets have ripping up wires $N_R$ can be denoted. Each net $N_i \in N_R$ has two pseudo pins $B_i$ and $C_i$, which are disconnected. Without loss of generality, pseudo pin $B_i$ must have a parent pin $A_i$, which is closer to the driver or the driver itself. $d_{A \to B}$ can be used to represent the direction of the wire connecting A and B in the original design. In Phase III, pin B can be moved in the direction opposite to $d_{A \to B}$ across A. For example, if B is at the east of A in the original design, now B can be moved to the west of A. In the opposite side of A, the location of B can be determined that is nearest to A and has space for B to be connected to BEOL layers. Such moves cause wire detour that can confuse attackers as in layout 1003. Minimizing the distance between A and B is to restrict the wire length overhead due to such moves.

Figure 12:
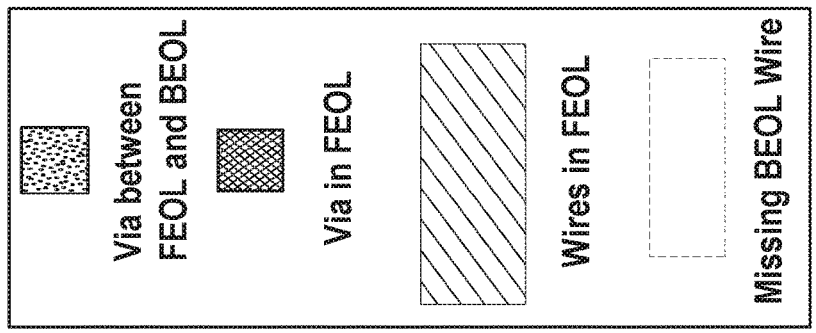
FIG. 12 is a layout of a circuit according to various example embodiments.
Figure 12:
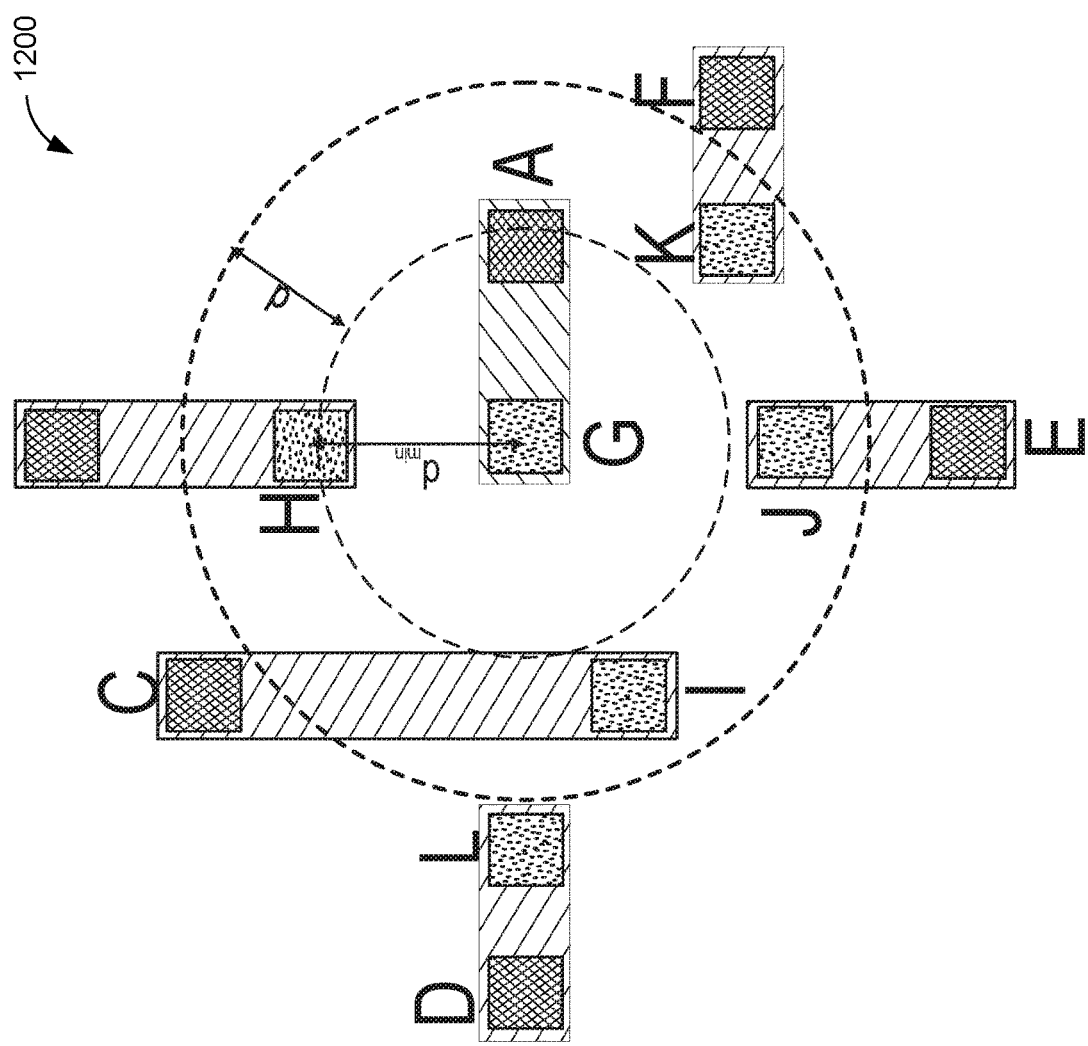

A fourth phase can include performing a sink side decoy perturbation. With reference to FIG. 12, shown is a layout 1200 according to various embodiments of the present disclosure. In layout 1200, G is a sink-side pseudo pin, and A is a sink node of the same net. Pseudo pin G is to the south of A in the original layout. In the sink side decoy phase, G can be moved to the north of A as in layout 1200. The sink side decoy perturbation can be somewhat similar to the driver side detour perturbation. The main difference is that the distance between G and A is not necessarily the minimum one, but is the one with multiple decoy pins nearby. Several candidate locations to the west of A can be evaluated for placing G. For each location, the nearest driver side pseudo pin of another net can be identified first, which is decoy pin H in layout 1200. The distance between G and H is denoted as $d_{min}$. Next, a search can be performed to determine if there are other decoy pins in the ring from $d_{min}$ to $d_{min}+d'$. The ring region can be indicated by the two dashed circles in layout 1200. It can be noted that the parent node of G in the original design should be in this ring, so that it can be confused with decoy pins. A driver pseudo pin of another net can be a decoy if its connection with G does not cause any wire detour, i.e., it can easily invalidate the proximity attack. Hence, only H and J are decoy pins in layout 1200. Then, the average logic difference between the original driver side pins and the decoy pins can be evaluated. Suppose the original driver side pseudo pin for G is M, by performing logic simulations, the logic difference $\Delta_{H,M}$ between pseudo pin H and M can be found, which is defined as the probability that H and M have opposite Boolean values. Among the candidate locations, a location for G can be chosen where the average logic difference of its decoy pins is maximized.

A fifth phase can include BEOL wire rerouting. After the pseudo pin locations are perturbed in Phases III and IV, the pseudo pins $B_i$ and $C_i$ can be reconnected for each net $N_i \in N_R$ using BEOL layers. The rerouting can be performed by any conventional method, such as maze routing or using a commercial routing software.

According to one example embodiment, the perturbation techniques were tested on ISCAS'85 benchmarks and ITC'99 benchmarks. Each circuit was synthesized using Synopsys Design Compiler tool. Cadence SoC Encounter and a 45 nm standard cell library were utilized for floor-planning, placement and routing. The first four phases were implemented in C++ language. The firth phase was performed by Cadence SoC Encounter in ECO mode. The timing results were obtained using Synopsys PrimeTime. The experiments were run on Dell PowerEdge R815 server with 4 AMD Opteron 6174 Processors (48 2.2 GHz cores), 256 GB of Memory and CentOS Linux operating system. The effectiveness of defense perturbation techniques was accessed by comparing the restored designs from an attacker and the original designs. The placement perturbation-based defense was also implemented for comparison. The security of the results were evaluated by the following metrics, although other metrics can be used:

1. Incorrect Connection Rate (ICR): the ratio of the number of wrong connections in an attack versus the number of critical nets which are nets in BEOL and the topmost FEOL layers.
2. Output Error Rate (OER): the probability of output pin errors in restored designs.
3. Hamming Distance (HD): the Hamming distance between the output vectors of the original design and the restored design. The term "Hamming distance" is used to indicate this metric. The output error rate and Hamming distance were estimated by 50K runs of Monte Carlo simulations.

TABLE 4

ATTACK INCORRECT CONNECTION RATE(ICR), OUTPUT ERROR RATE (OER) AND HAMMING DISTANCE (HD) FOR DESIGN WITHOUT AND WITH DEFENSE, AND WIRELENGTH OVERHEAD (WLO), TIMING OVERHEAD (TO) AND CRITICAL PATH DELAY INCREASING ($\Delta d$)

| | | Without defense | | | | Proposed routing-based defense | | | | | | | | Placement perturbation based defense [23] | | | | |
|---|---|---|---|---|---|---|---|---|---|---|---|---|---|---|---|---|---|---|
| Test-case | #Nets | ICR (%) | OER (%) | HD (%) | #Global nets | ICR (%) | OER (%) | HD (%) | #Re-routed nets | WLO (%) | TO (%) | $\Delta d$ (ps) | Run-time (s) | ICR (%) | OER (%) | HD (%) | WLO (%) | TO (%) |
| c432 | 145 | 7.6 | 75.4 | 23.4 | 24 | 21.2 | 99.4 | 46.1 | 34 | 3.1 | 0.26 | 2.1 | 0.01 | 9.3 | 98.8 | 41.8 | 4 | 0.51 |
| c880 | 252 | 0 | 0 | 0 | 8 | 52.5 | 99.9 | 18 | 40 | 4.3 | 0.69 | 4.5 | 0.03 | 3.2 | 15.8 | 1.2 | 9 | 0.05 |
| c1335 | 263 | 4.6 | 59.5 | 2.4 | 39 | 22.9 | 100 | 26.6 | 74 | 4.4 | 0.18 | 1.3 | 0.03 | 6.8 | 94.5 | 8 | 6.4 | 0.73 |
| c1908 | 230 | 2.5 | 52.3 | 4.3 | 32 | 16.2 | 100 | 38.8 | 56 | 3.7 | 0.11 | 1.1 | 0.03 | 9 | 97.8 | 17.7 | 12.4 | 1.39 |
| c2670 | 607 | 13.7 | 99.9 | 7 | 91 | 41.7 | 100 | 14 | 86 | 4.4 | 0.14 | 1.1 | 0.07 | 13.7 | 100 | 7.5 | 2.6 | 0.28 |
| c3540 | 638 | 11.8 | 95.4 | 18.2 | 36 | 23 | 100 | 36.1 | 48 | 1.3 | 0.06 | 0.7 | 0.06 | 17.4 | 98.8 | 27.9 | 4.8 | 0.28 |
| c5315 | 997 | 6.5 | 98.7 | 4.3 | 43 | 25.3 | 100 | 18.1 | 53 | 1.7 | -0.02 | -0.2 | 0.14 | 8.9 | 98.7 | 12.5 | 7.1 | 0.1 |
| c6288 | 1921 | 2.2 | 36.8 | 3 | 8 | 19.1 | 100 | 42.1 | 53 | 1.8 | 0.11 | 3.2 | 0.28 | 2.4 | 74.2 | 16.5 | 5.6 | 0.19 |
| c7552 | 1041 | 2.2 | 69.5 | 1.6 | 45 | 26.1 | 100 | 20.3 | 66 | 2.2 | 0.41 | 5.1 | 0.14 | 2.1 | 81.7 | 3.1 | 5.3 | -0.36 |
| b07 | 308 | 11.7 | 93.2 | 8.2 | 18 | 46.7 | 100 | 23.6 | 27 | 2.7 | 0.06 | 0.5 | 0.02 | 13.8 | 98.9 | 14.7 | 7.7 | 0.19 |
| b11 | 383 | 0 | 0 | 0 | 3 | 32.8 | 100 | 24.5 | 36 | 2.1 | 0.06 | 0.5 | 0.06 | 1.4 | 44.5 | 1.4 | 4.5 | -0.07 |
| b13 | 237 | 10.3 | 92.4 | 6.4 | 21 | 39.7 | 100 | 20.7 | 24 | 2.3 | 0.59 | 2.1 | 0.02 | 8.6 | 91.5 | 3.8 | 7.9 | 0.17 |
| b14_1 | 3018 | 13.5 | 99.6 | 5.3 | 58 | 52.6 | 100 | 20.7 | 76 | 4.4 | 0.31 | 9.3 | 9.62 | 16.3 | 100 | 9.9 | 5.7 | 0.86 |
| b15 | 6018 | 15.8 | 100 | 7 | 124 | 33 | 100 | 19.1 | 119 | 1 | 0.08 | 2.3 | 1.93 | 18.3 | 100 | 6.7 | 8.4 | 2 |
| b17 | 18613 | 32.1 | 100 | 18.5 | 795 | 61 | 100 | 32.3 | 1160 | 3.6 | 0.37 | 15.1 | 17 | 32.3 | 100 | 22.3 | 11.2 | 2.73 |
| b18 | 50029 | 37.2 | 100 | 19.9 | 1884 | 62.1 | 100 | 31.7 | 2375 | 4.1 | 0.27 | 11.3 | 108 | 36.7 | 100 | 21 | 7.3 | 2.38 |
| Avg. | | 10.7 | 73.3 | 8.1 | | 36 | 100 | 27 | | 2.9 | 0.23 | 3.75 | | 12.5 | 87.2 | 13.5 | 6.9 | 0.72 |

The main results are listed in Table 4 where circuits with names starting with letter "c" and "b" are from ISCAS'85 and ITC'99 benchmark suites, respectively. Without defense, the attack achieves incorrect connection rate (ICR) as low as 11%, i.e., near 90% if the guess results by the attack is correct. The placement based defense makes little improvement while the five phase perturbation technique increases ICR to 36% on average. The five phase perturbation technique also increases the OER of attack from 87% to near 100% compared to placement based techniques. The five phase perturbation technique doubles the Hamming distance, which is a strong security metric, versus that of placement based technique and makes a big step toward the ideal goal of 50%. Overall, the five phase perturbation technique remarkably outperforms the placement based technique on all three security metrics. At the same time, the wire length overhead from the five phase technique is about 3% on average, which is only a half of that from the placement based technique. On average, the critical path delay increase from the five phase perturbation technique is less than 4 ps and accounts for only 0.23% relative overhead.

Figure 13:
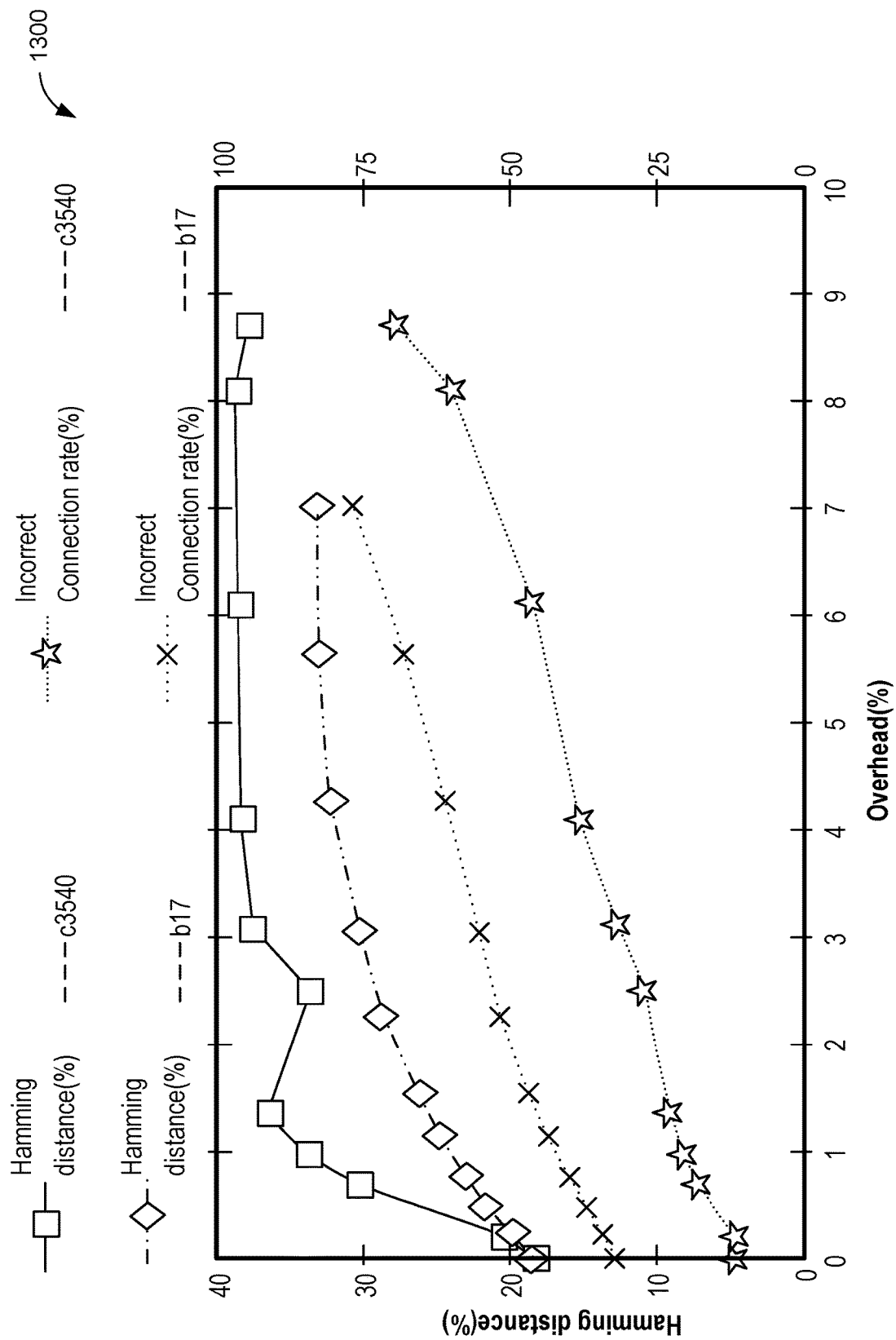
FIG. 13 is a graph of the Hamming distance percentage with respect to overhead percentage according to various embodiments of the present disclosure.

With reference to FIG. 13, shown is a graph 1300 according to various embodiments of the present disclosure. The graph 1300 illustrates an example of a security vs. overhead tradeoff. One appealing feature of the perturbation techniques disclosed herein are that the security and wire length overhead can be controlled by varying the parameter p. An experiment was performed to validate this feature on circuit c3540 of the ISCAS'85 benchmark and b17 of the ITC'99 benchmark. The results are depicted in graph 1300. For c3540, the maximum wire length overhead is limited to around 8% due to limited routing space. One can see that the perturbation techniques can achieve a nearly smooth tradeoff between the incorrect connection rate and wire length overhead. The tradeoff between Hamming distance and wire length is also clearly evident, but with a few kinks and saturation. This is because different wrong connections contribute to output errors differently. Comparison of three techniques.

Figure 14:
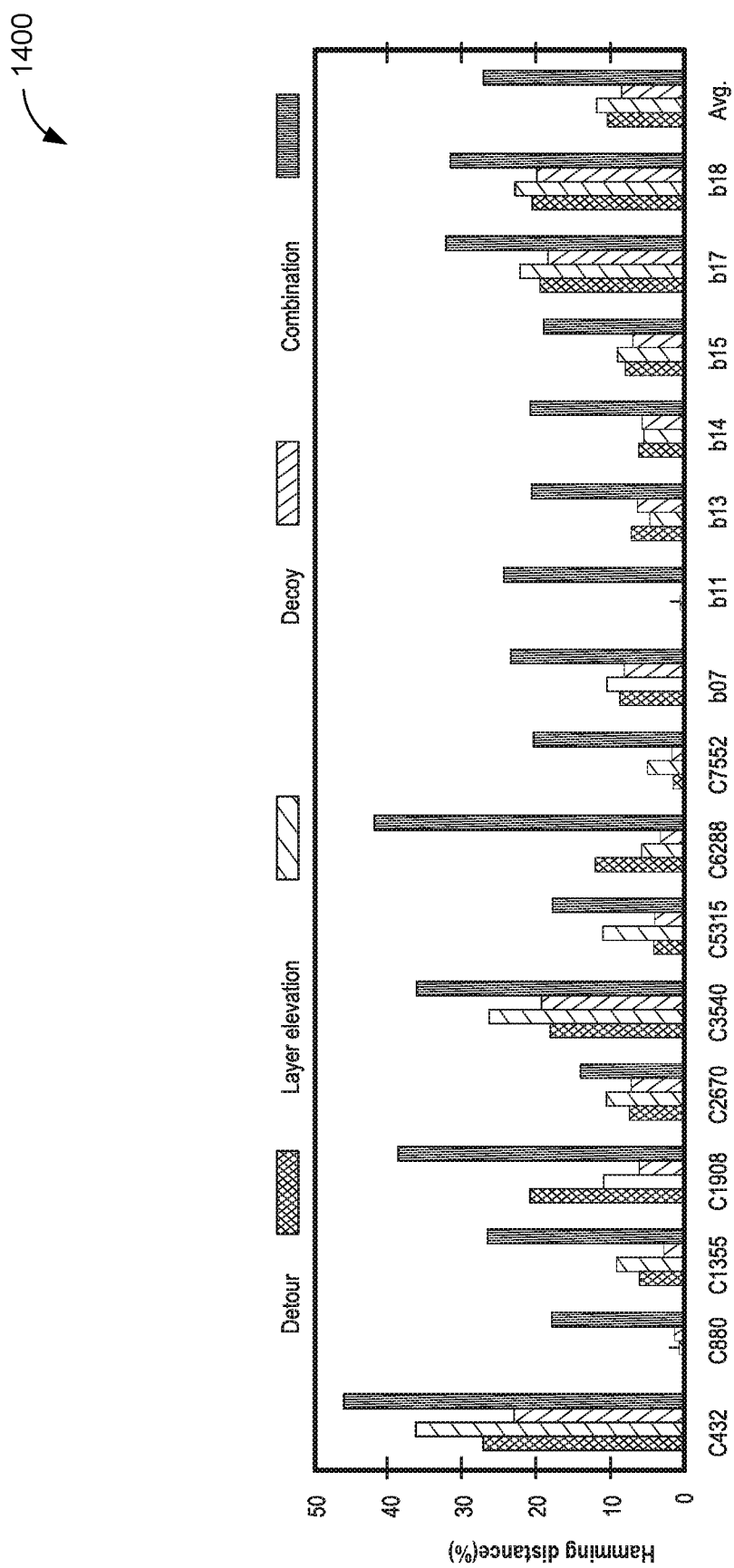
FIG. 14 is a graph of the Hamming distance percentage for different perturbation techniques according to various embodiments of the present disclosure.

With reference to FIG. 14, shown is a graph 1400 according to various embodiments of the present disclosure. The graph 1400 illustrates the impact of each technique. Specifically, the comparison includes (1) only driver-side detour of global nets, (2) layer elevation and detour of local nets, and (3) sinkside decoy for global nets with the overall method. For most circuits in graph 1400, layer elevation case has the best result in three individual techniques, for example circuit c432 and c3540 because layer elevation increases the number of global nets, thereby increasing the search space for an attacker. In addition, the routing detour is also made for the elevated wires. The effect of individual technique is limited. The best result comes when all these perturbation techniques—layer elevation, detour, and decoy—are combined together. This is especially obvious for circuits c880, c6288, and b11.

With reference to Hamming distance and output error rate, without using the disclosed perturbation defense techniques, the Hamming distance achieved by the attack is only 8%. In other words, the attacker gains more, as the ideal value should be 50%. Our defense has almost quadrupled this rate to 28%. This is still not 50%, even though our defense increased the output error rate to 99%. This Hamming distance can be further increased by using incorporating perturbation defenses during logic synthesis, as the proposed perturbation technique does during physical design synthesis.

Pin-swapping defense is a technique where pins of partitions blocks are moved to achieve a target Hamming distance of 50% using testing principles such as fault activation and propagation. The disclosed perturbation technique can differ from the pin-swapping defense technique in the following aspects: (i) Pin-swapping based defense is applicable only to hierarchical designs; the disclosed techniques are applicable to industry-relevant flattened designs. (ii) Pin-swapping is a passive technique, as it takes existing global nets and identifies the best set of wires among this set to swap, whereas the disclosed techniques are active techniques, as it considers all the wires in the design and selects the best for layer elevation, detour, etc. (iii) Detour and Decoy are new techniques. (iv) Unlike pin-swapping based defense, wherein the execution time is in hours, the disclosed techniques are practical, as the execution time is only in seconds. (v) Pin-swapping based defense results in an overhead of 25% in terms of wire length, whereas the disclosed technique result in a wire length overhead of 3%. Furthermore, the overhead is controllable in the disclosed techniques.

Figure 15:
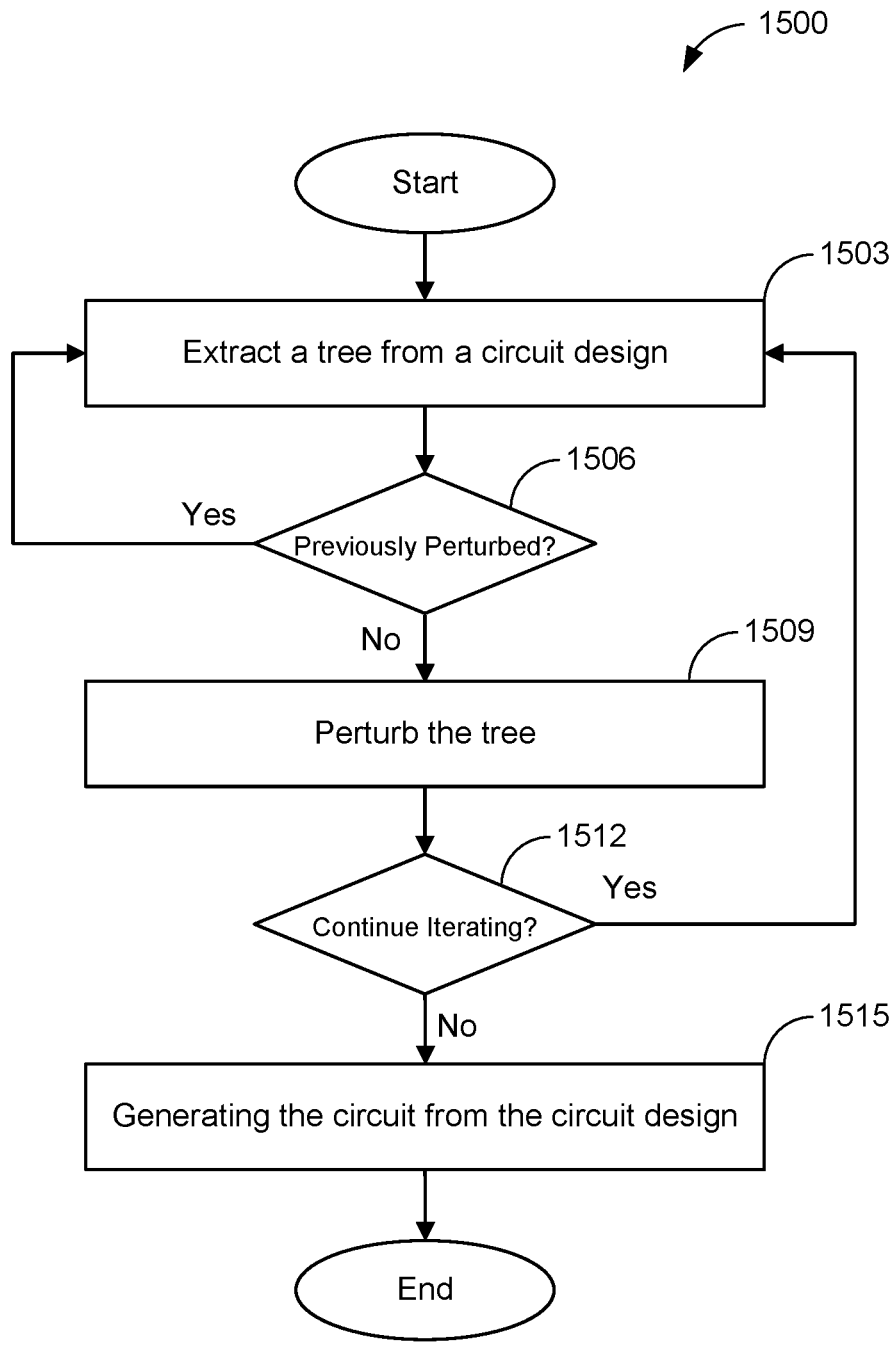
FIG. 15 illustrates an example flowchart of certain functionality implemented by portions of an application executed in a computing device according to various embodiments of the present disclosure.

Before turning to the process flow diagrams of FIG. 15, it is noted that embodiments described herein may be practiced using an alternative order of the steps illustrated in FIG. 15. That is, the process flows illustrated in FIG. 15 are provided as examples only, and the embodiments may be practiced using process flows that differ from those illustrated. Additionally, it is noted that not all steps are required in every embodiment. In other words, one or more of the steps may be omitted or replaced, without departing from the spirit and scope of the embodiments. Further, steps may be performed in different orders, in parallel with one another, or omitted entirely, and/or certain additional steps may be performed without departing from the scope and spirit of the embodiments.

At box 1503, the process 1500 includes extracting a tree from a circuit design. An application can extract the tree from a layout circuit. The locations of gates in the circuit can be extracted. The application can select the tree for extraction such that one or more wires in the tree are in a missing layer, such as an upper metal layer. The tree extracted can correspond to a tree root when a gate has fanin nets on upper metal layers. The extraction can proceed with reverse topological traversal. A gate can be included into the tree traversal as long as the tree topology can be maintained. The traversal/extraction can terminate at the primary input pins.

At box 1506, the process includes determining whether the tree was previously perturbed. If so, the process can move to box 1503. Otherwise, the process proceeds to box 1509.

At box 1509, the process 1500 includes perturbing the tree. An application executed in a computing device can perturb one or more gates of the extracted tree. The gates can be perturbed using one or more of a placement perturbation technique, a layer elevation technique, a routing detour perturbation technique, and/or a decoy perturbation technique. In some embodiments, the gates can be perturbed using a Pareto optimization approach. In other embodiments, the gates can be perturbed using a five phase perturbing process.

At box 1512, the process 1500 includes determining whether to continue iterating. If so, the process moves to box 1503. Otherwise, the process 1500 proceeds to box 1515.

At box 1515, the process 1500 includes generating the circuit with one or more perturbed gates. The application can generate the circuit by generating one or more layout files describing the circuit. Some of the layout files can correspond to BEOL information and some of the layout files can correspond to FEOL information. The FEOL information can be transmitted to a foundry for manufacturing. The resulting integrated circuit chips can be sent to another foundry along with the BEOL information to complete the manufacturing process.

Figure 16:
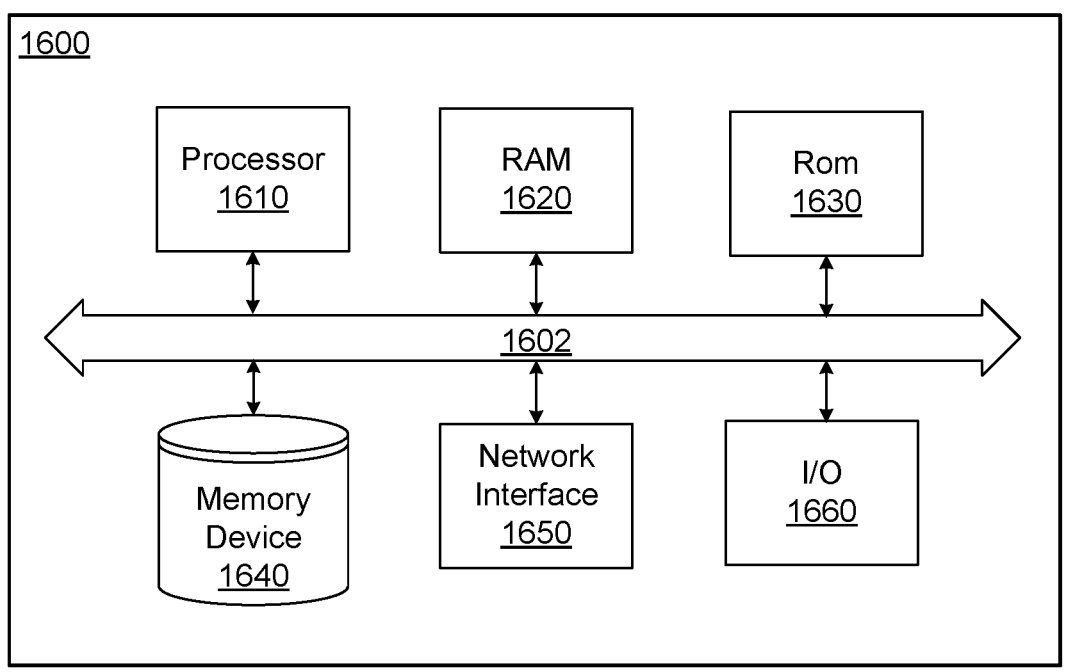
FIG. 16 is a schematic block diagram that illustrates an example computing device according to various embodiments.

Turning to FIG. 16, an example hardware diagram of a computing device 1600 is illustrated. Any of the functionality described herein can be implemented at least in part in one or more computing devices 1600. The computing device 1600 includes a processor 1610, a Random Access Memory ("RAM") 1620, a Read Only Memory ("ROM") 1630, a memory device 1640, a network interface 1650, and an Input Output ("I/O") interface 1660. The elements of the computing device 1600 are communicatively coupled via a bus 1602.

The processor 1610 can include a hardware arithmetic processor or Application Specific Integrated Circuit ("ASIC"). The RAM and ROM 1620 and 1630 can include random access or read only memory device that store computer-readable instructions to be executed by the processor 1610. The memory device 1640 can store computer-readable instructions thereon that, when executed by the processor 1610, direct the processor 1610 to execute various aspects of the present disclosure described herein. When the processor 1610 comprises an ASIC, the processes described herein may be executed by the ASIC according to an embedded circuitry design of the ASIC, by firmware of the ASIC, or both an embedded circuitry design and firmware of the ASIC. As a non-limiting example group, the memory device 1640 can include one or more of an optical disc, a magnetic disc, a semiconductor memory (i.e., a semiconductor, floating gate, or similar flash based memory), a magnetic tape memory, a removable memory, combinations thereof, or any other known memory means for storing computer-readable instructions. The network interface 1650 can include hardware interfaces to communicate over data networks. The I/O interface 1660 can include device input and output interfaces such as keyboard, pointing device, display, communication, and other interfaces. The bus 1602 can electrically and/or communicatively couple the processor 1610, the RAM 1620, the ROM 1630, the memory device 1640, the network interface 1650, and the I/O interface 1660, so that data and instructions may be communicated among them.

In operation, the processor 1610 can be configured to retrieve computer-readable instructions stored on the memory device 1640, the RAM 1620, the ROM 1630, or another storage means, and copy the computer-readable instructions to the RAM 1620 or the ROM 1630 for execution, for example. The processor 1610 can be further configured to execute the computer-readable instructions to implement various aspects and features of the present disclosure. For example, the processor 1610 may be adapted and configured to execute the processes described above.

A phrase, such as "at least one of X, Y, or Z," unless specifically stated otherwise, is to be understood with the context as used in general to present that an item, term, etc., can be either X, Y, or Z, or any combination thereof (e.g., X, Y, and/or Z). Similarly, "at least one of X, Y, and Z," unless specifically stated otherwise, is to be understood to present that an item, term, etc., can be either X, Y, and Z, or any combination thereof (e.g., X, Y, and/or Z). Thus, as used herein, such phrases are not generally intended to, and should not, imply that certain embodiments require at least one of either X, Y, or Z to be present, but not, for example, one X and one Y. Further, such phrases should not imply that certain embodiments require each of at least one of X, at least one of Y, and at least one of Z to be present.

Although embodiments have been described herein in detail, the descriptions are by way of example. The features of the embodiments described herein are representative and, in alternative embodiments, certain features and elements may be added or omitted. Additionally, modifications to aspects of the embodiments described herein may be made by those skilled in the art without departing from the spirit and scope of the present invention defined in the following claims, the scope of which are to be accorded the broadest interpretation so as to encompass modifications and equivalent structures.

Therefore, at least the following is claimed:

1. A system comprising:
a memory device comprising a circuit design; and
at least one computing device configured to at least:
subsequent to a global routing of the circuit design and an assignment of wire layers for the circuit design, extract a tree from the circuit design, the tree comprising a plurality of gates and a plurality of locations individually corresponding to a respective one of the plurality of gates, the tree being a topology based at least in part on the assignment of wire layers; and
perturb the tree by moving at least one location of the plurality of locations for at least one gate of the plurality of gates.

2. The system of claim 1, wherein the at least one computing device is further configured to at least:
extract a second tree from the circuit design; and
perturb the second tree.

3. The system of claim 1, wherein the at least one computing device is further configured to at least:
extract a second tree from the circuit design, the second tree comprising a plurality of second gates;
determine that one of the plurality of second gates has been perturbed previously; and
extract another tree from the circuit design without perturbing the second tree based at least in part on one of the plurality of second gates being previously perturbed.

4. The system of claim 1, wherein the circuit design corresponds to a flattened circuit design.

5. The system of claim 1, wherein the tree is perturbed based on at least one of: a placement perturbation technique, a layer elevation technique, a routing detour perturbation technique, and a decoy perturbation technique.

6. The system of claim 1, wherein the at least one location is selected based at least in part on the at least one gate being part of a dangling wire.

7. The system of claim 1, wherein the at least one computing device is further configured to perturb the tree by at least ripping up global wire segments; ripping up local nets; generating pseudo pins; performing a driver side detour perturbation; performing a sink side decoy perturbation; and rerouting BEOL wires.

8. A method comprising:
subsequent to a global routing of a circuit design and an assignment of wire layers for the circuit design, extracting, via at least one computing device, a tree from the circuit design, the tree comprising a plurality of gates and a plurality of locations individually corresponding to a respective one of the plurality of gates, the tree being a topology based at least in part on the assignment of wire layers; and perturbing, via the at least one computing device, the tree by moving at least one location of the plurality of locations for at least one gate of the plurality of gates.

9. The method of claim 8, further comprising:
extracting, via the at least one computing device, a second tree from the circuit design; and
perturbing, via the at least one computing device, the second tree.

10. The method of claim 8, further comprising:
extracting, via the at least one computing device, a second tree from the circuit design, the second tree comprising a plurality of second gates;
determining, via the at least one computing device, that one of the plurality of second gates has been perturbed previously; and
extracting, via the at least one computing device another tree from the circuit design without perturbing the second tree based at least in part on one of the plurality of seconds gates being previously perturbed.

11. The method of claim 8, wherein a pair of gates of the plurality of gates are connected via a wire in a back-end-of-line (BEOL) layer.

12. The method of claim 8, wherein the circuit design comprises at least one front-end-of-line (FEOL) layers and omits at least one BEOL layer.

13. The method of claim 8, wherein the at least one location is selected based at least in part on the at least one gate being part of a dangling wire.

14. The method of claim 8, further comprising generating, via the at least one computing device, a decoy by moving the at least one location to a resulting location in a direction of at least one other gate, the at least one other gate not being directly electrically connected to the at least one gate.

15. A non-transitory computer-readable medium embodying a program that, when executed in at least one computing device, causes the at least one computing device to at least:
subsequent to a global routing of a circuit design and an assignment of wire layers for the circuit design, extract a tree from the circuit design, the tree comprising a plurality of gates and a plurality of locations individually corresponding to a respective one of the plurality of gates, the tree being a topology based at least in part on the assignment of wire layers; and
perturb the tree by moving at least one location of the plurality of locations for at least one gate of the plurality of gates.

16. The non-transitory computer-readable medium of claim 15, wherein the at least one computing device is further configured to at least:
extract a second tree from the circuit design; and
perturb the second tree.

17. The non-transitory computer-readable medium of claim 15, wherein the at least one computing device is further configured to at least:
extract a second tree from the circuit design, the second tree comprising a plurality of second gates;
determine that one of the plurality of second gates has been perturbed previously; and
extract another tree from the circuit design without perturbing the second tree based at least in part on one of the plurality of second gates being previously perturbed.

18. The non-transitory computer-readable medium of claim 15, wherein the circuit design comprises at least one front-end-of-line (FEOL) layers and omits at least one BEOL layer.

19. The non-transitory computer-readable medium of claim 15, wherein the at least one location is selected based at least in part on the at least one gate being part of a dangling wire.

20. The non-transitory computer-readable medium of claim 15, wherein the at least one computing device is further configured to at least generate a decoy by moving the at least one location to a resulting location in a direction of at least one other gate, the at least one other gate not being directly electrically connected to the at least one gate.

* * * * *